United States Patent
You et al.

(10) Patent No.: US 6,518,630 B2
(45) Date of Patent: Feb. 11, 2003

(54) THIN FILM TRANSISTOR ARRAY SUBSTRATE FOR LIQUID CRYSTAL DISPLAY AND METHOD FOR FABRICATING SAME

(75) Inventors: Chun-Gi You, Yongin (KR); Hyang-Shik Kong, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/988,169

(22) Filed: Nov. 19, 2001

(65) Prior Publication Data

US 2002/0105030 A1 Aug. 8, 2002

(30) Foreign Application Priority Data

Feb. 5, 2001 (KR) .............................. 01-5392
Feb. 7, 2001 (KR) .............................. 01-5847

(51) Int. Cl.[7] ..................... H01L 31/0392; H01L 27/01; H01L 27/12
(52) U.S. Cl. ........................... 257/380; 257/59; 257/72
(58) Field of Search .............................. 257/59, 61, 72, 257/350

(56) References Cited

U.S. PATENT DOCUMENTS

| | | | |
|---|---|---|---|
| 5,990,986 A | * 11/1999 | Song et al. | 349/43 |
| 6,255,706 B1 | * 7/2001 | Watanabe et al. | 257/412 |
| 6,376,861 B1 | * 4/2002 | Yaegashi et al. | 257/59 |
| 6,377,323 B1 | * 4/2002 | Ono et al. | 349/43 |

* cited by examiner

Primary Examiner—Ngân V. Ngô
(74) Attorney, Agent, or Firm—Hae-Chan Park; McGuireWoods LLP

(57) ABSTRACT

A thin film transistor array substrate includes a substrate, a gate wire with a gate line and a gate electrode formed on the substrate, a gate insulating layer covering the gate wire, and a semiconductor pattern formed on the gate insulating layer. A data wire is formed on the gate insulating layer and the semiconductor pattern with a data line, and a source electrode and a drain electrode. The data wire bears a multiple-layered structure having a metallic layer and an intermetallic compound layer. A protective layer is formed on the data wire and the semiconductor pattern. A pixel electrode is formed on the protective layer while contacting the drain electrode through a contact hole.

21 Claims, 27 Drawing Sheets

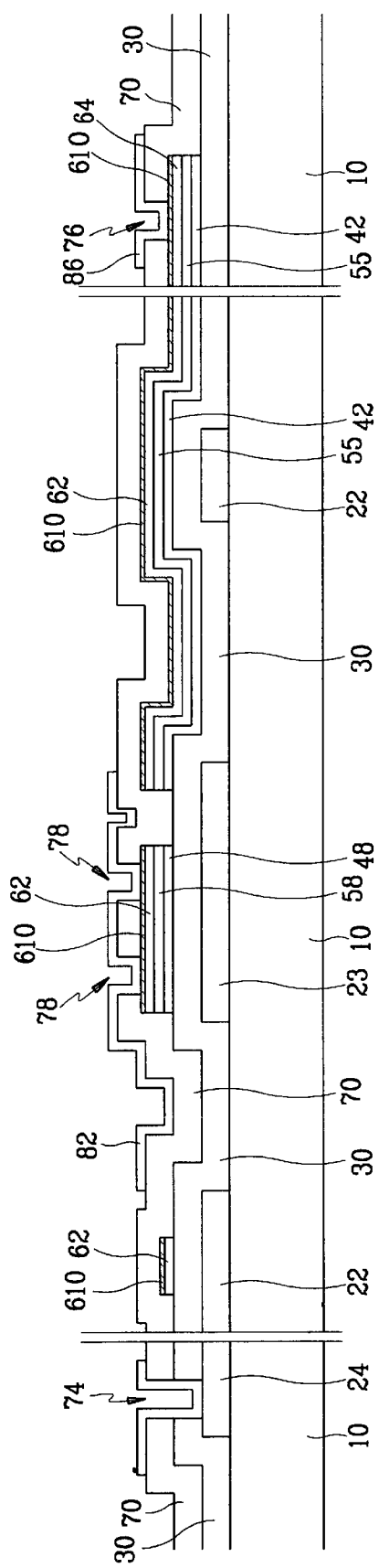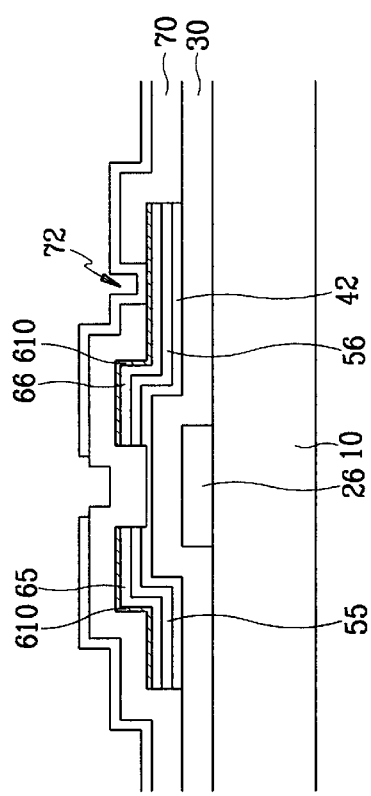

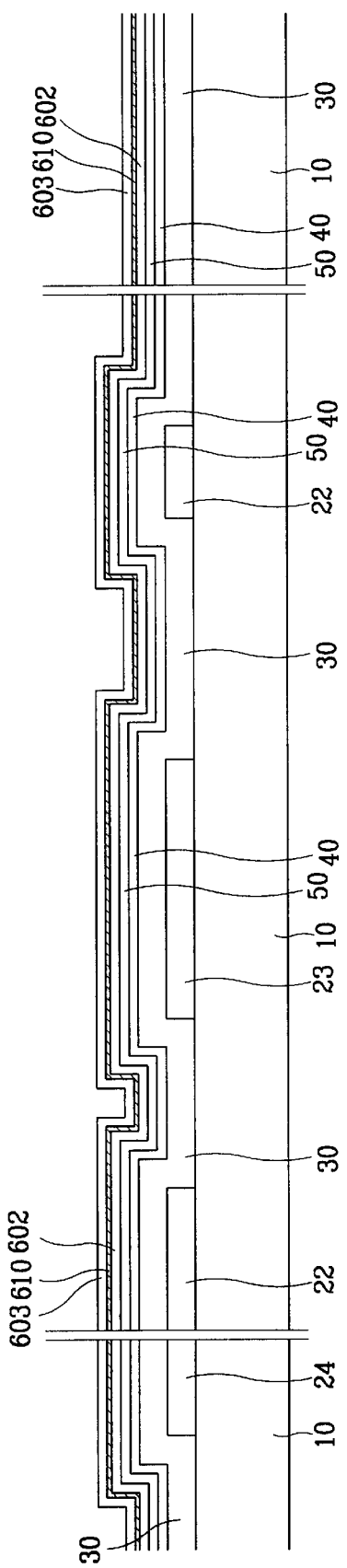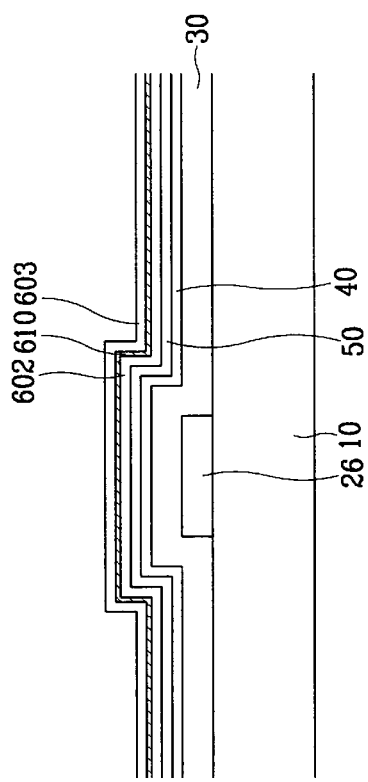

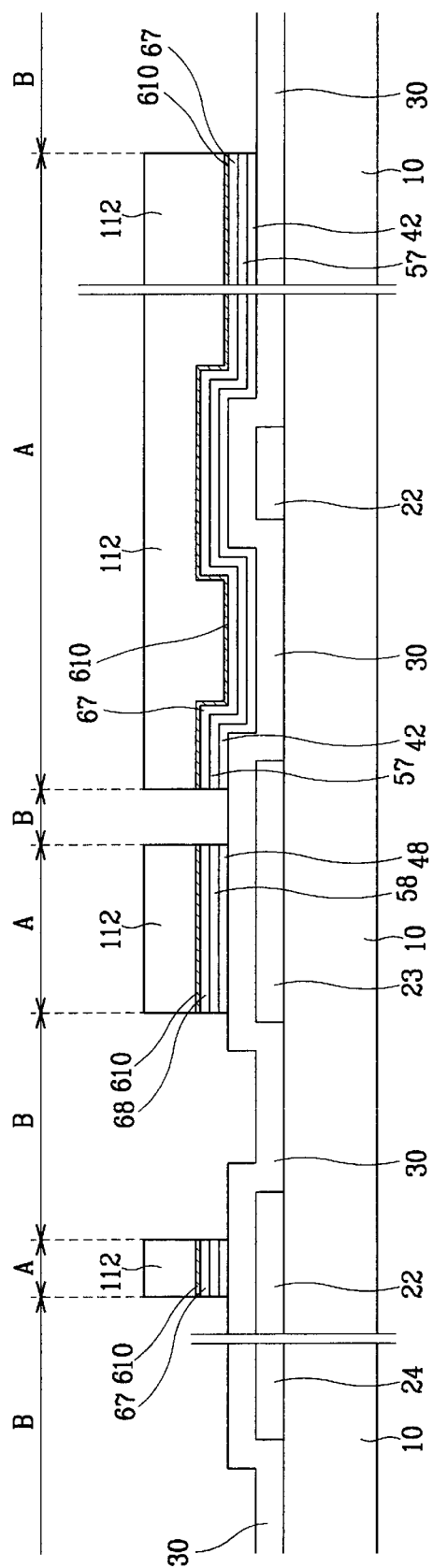
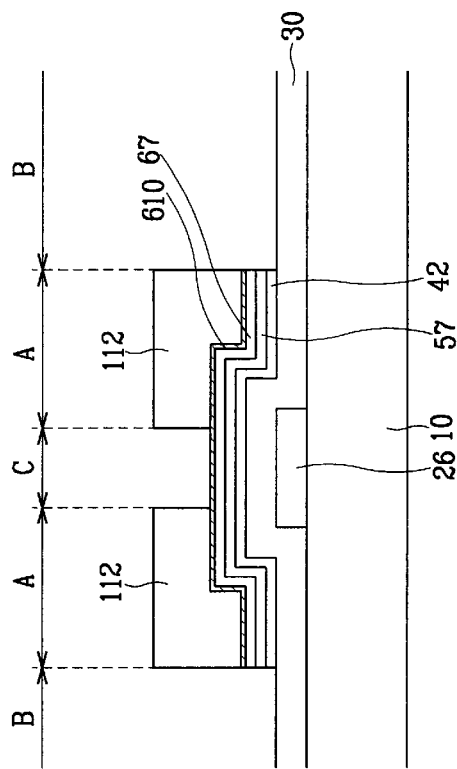
FIG. 18A
FIG. 18B

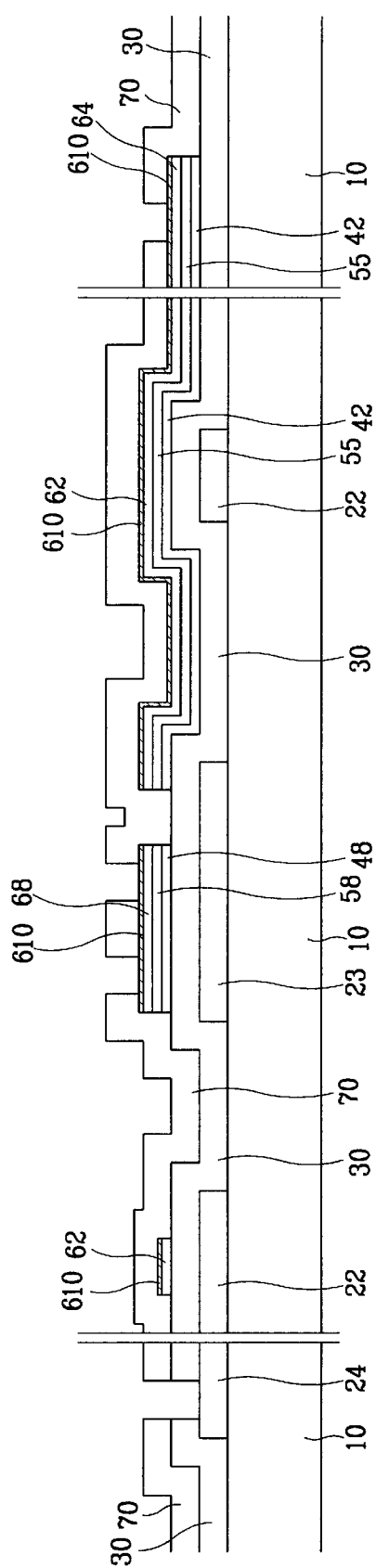

THIN FILM TRANSISTOR ARRAY SUBSTRATE FOR LIQUID CRYSTAL DISPLAY AND METHOD FOR FABRICATING SAME

BACKGROUND OF THE INVENTION (a) Field of the Invention

The present invention relates to a thin film transistor array substrate for a liquid crystal display and a method for fabricating the same.

(b) Description of the Related Art

Generally, liquid crystal displays have a structure where a liquid crystal is sandwiched between two substrates, and an electric field is applied to the liquid crystal to control light transmission. Electrodes are formed on the two substrates, and voltages are applied to the electrodes. One of the substrates has thin film transistors to switch the applied voltages, and is called a "thin film transistor array substrate."

The thin film transistor array substrate is formed through photolithography using a number of masks. In order to reduce production cost, it is required that the number of masks be decreased.

Meanwhile, the signal lines for the thin film transistor array substrate are usually formed of a low resistance material such as aluminum (Al) or aluminum alloy (Al alloy) to prevent signal delay. However, indium tin oxide (ITO) commonly used for pad portions bears poor contact characteristic with the Al or Al alloy. Therefore, the Al or Al alloy at the pad portions should be replaced with another metallic material such as molybdenum (Mo) or chrome (Cr), and this results in complicated processing steps. In order to solve such a problem, it has been proposed that indium zinc oxide (IZO) should be used to form the pad portions while enhancing reliability thereof. However, in this case, the contact resistance at the pad portions increases while deteriorating the device performance characteristics.

SUMMARY OF THE INVENTION

It is an object of the present invention to provide a thin film transistor array substrate for a liquid crystal display which has low resistance material-based signal lines while insuring the reliability of pad portions.

It is another object of the present invention to provide a method for fabricating a thin film transistor array substrate in simplified processing steps.

These and other objects may be achieved by a thin film transistor array substrate having an intermetallic compound layer interposed between an aluminumbased layer and an indium zinc oxide layer.

The thin film transistor array substrate includes a substrate, and a gate wire formed on the substrate with a gate line and a gate electrode, a gate insulating layer covering the gate wire, and a semiconductor pattern formed on the gate insulating layer. A data wire is formed on the gate insulating layer and the semiconductor pattern with a data line, a source electrode and a drain electrode. The data wire bears a multiple-layered structure where a first metallic layer and an intermetallic compound layer are present. A protective layer is formed on the data wire and the semiconductor pattern. The drain electrode is exposed through a first contact hole, and a pixel electrode contacts the drain electrode. The intermetallic compound layer may be formed on the first metallic layer, and a second metallic layer may cover the intermetallic compound layer.

The first metallic layer may be formed with an aluminum-based metallic material, and the second metallic layer with molybdenum, titanium, tantalum or chrome. The intermetallic compound layer may be formed with a compound containing chrome, molybdenum, or molybdenum alloy.

The first contact hole may be formed in the protective layer, and the pixel electrode may contact the intermetallic compound layer for the drain electrode. Alternatively, the pixel electrode may contact the second metallic layer for the drain electrode.

According to one aspect of the present invention, in a method of fabricating the thin film transistor array substrate, a gate wire is formed on an insulating substrate through depositing a conductive layer on the substrate and patterning it. A gate insulating layer is then formed on the substrate such that the gate insulating layer covers the gate wire. A semiconductor layer is formed on the gate insulating layer. A conductive layer for data wire and a metallic layer are deposited on the gate insulating layer in a sequential manner, and performs an annealing process. The metallic layer is then removed, and the conductive layer for data wire is patterned to thereby form a data wire. A protective layer is deposited on the substrate such that the protective layer covers the data wire. A first contact hole is formed such that the drain electrode is exposed through the first contact hole, and a pixel electrode is formed such that the pixel electrode is electrically connected to the drain electrode. An intermetallic compound layer may be formed between the conductive layer for data wire and the metallic layer through the annealing.

According to another aspect of the present invention, in a method of fabricating the thin film transistor array substrate, a gate wire is formed on a substrate through depositing a conductive layer on the substrate and patterning it. A gate insulating layer is then formed on the substrate such that the gate insulating layer covers the gate wire. A semiconductor pattern is formed on the gate insulating layer. A conductive layer for data wire and a metallic layer are deposited on the gate insulating layer and the semiconductor pattern in a sequential manner. The multiple-layered structure of the conductive layer for data wire and the metallic layer is then patterned to thereby form a data wire having a multiple-layered structure. A protective layer is formed such that the protective layer covers the semiconductor pattern. A first contact hole is formed such that the first contact hole exposes the drain electrode, and a pixel electrode is formed in the protective layer such that the pixel electrode is connected to the drain electrode through the first contact hole. An intermetallic compound may be formed between the conductive layer for data wire and the metallic layer through depositing the metallic layer at 150° C. or more.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components.

FIGS. 10 and 11 are cross sectional views of the thin film transistor array substrate taken along the X–X' line and the XI–XI' line of FIG. 9, respectively;

FIGS. 12A, 12B, 12C, 13A, 13B, 13C, 14A, 14B, 15A, 15B, 16A, 16B, 17A, 17B, 18A, 18B, 19A, 19B, 20A, 20B and 20C illustrate the steps of fabricating the thin film transistor array substrate shown in FIG. 9.

DETAILED DESCRIPTION OF THE PREFERRED EMBODIMENTS

Preferred embodiments of this invention will be explained with reference to the accompanying drawings.

Figure 1:
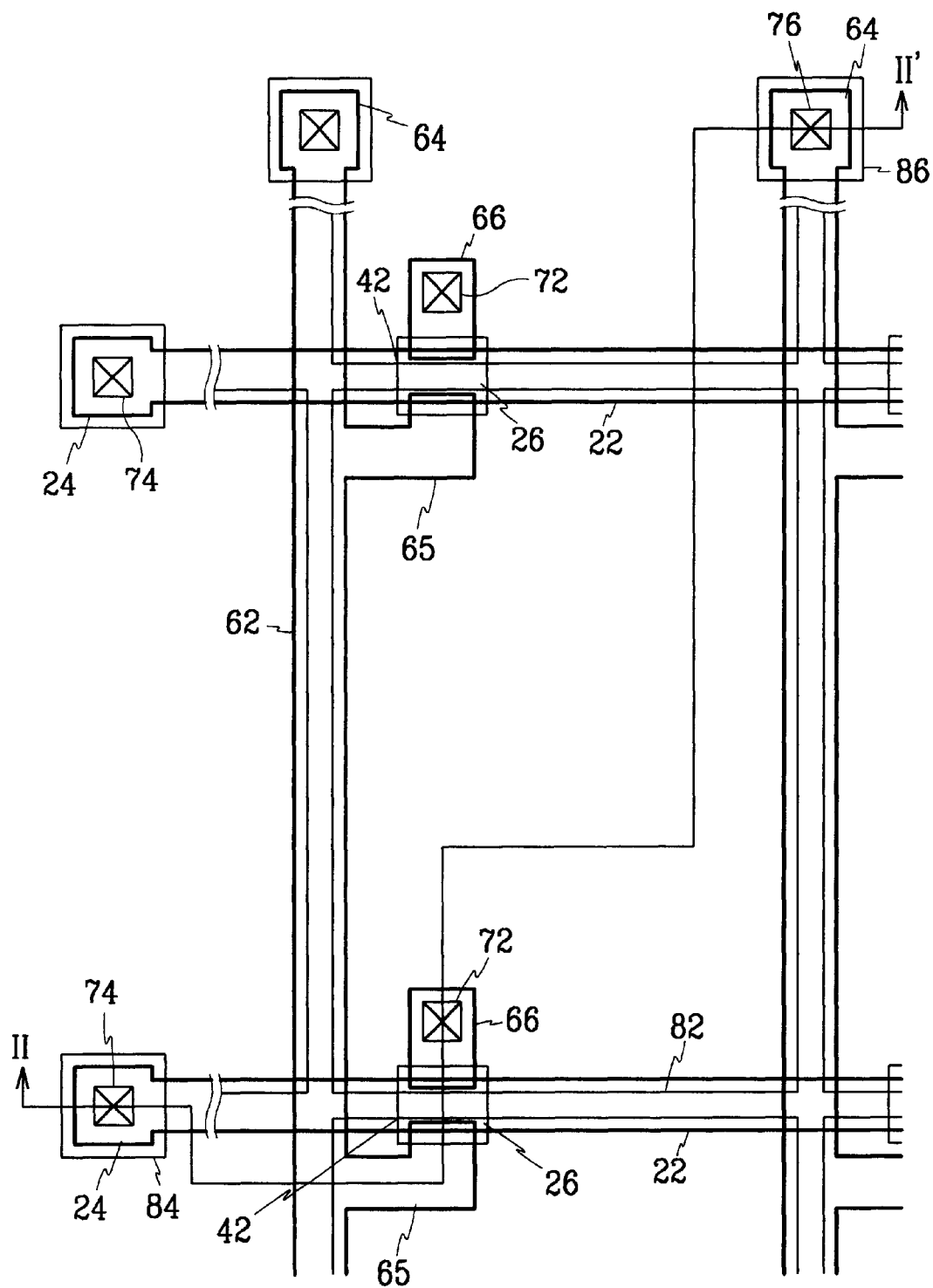
FIG. 1 is a plan view of a thin film transistor array substrate for a liquid crystal display according to a first preferred embodiment of the present invention.
Figure 2:
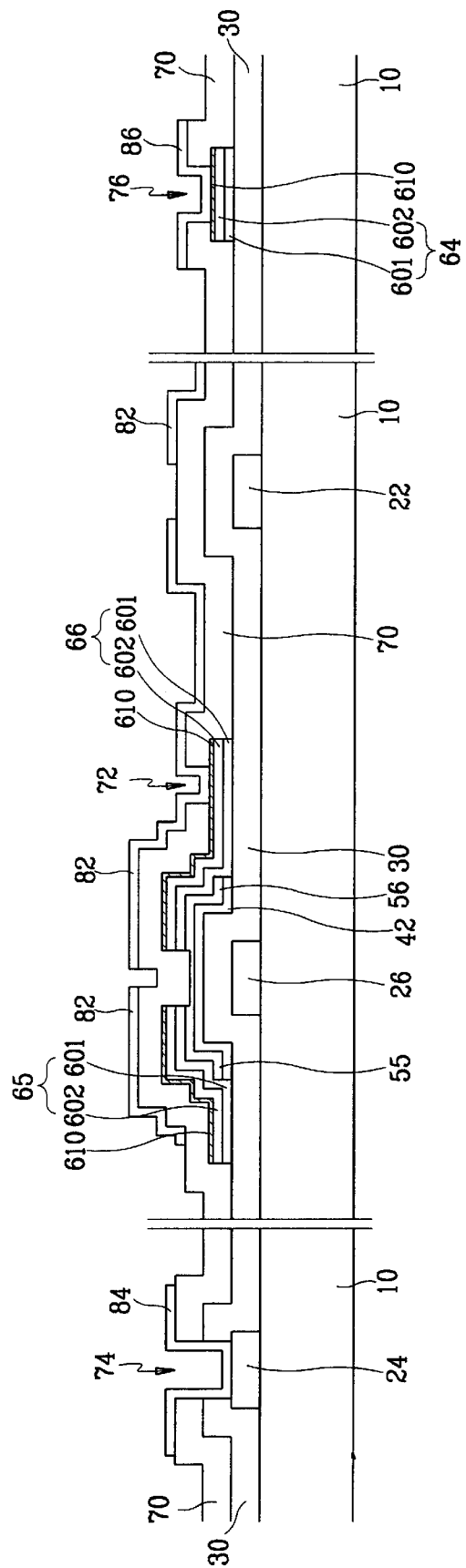
FIG. 2 is a cross sectional view of the thin film transistor array substrate taken along the II–II' line of FIG. 1.

FIG. 1 is a plan view of a thin film transistor array substrate for a liquid crystal display according to a first preferred embodiment of the present invention, and FIG. 2 is a cross sectional view of the thin film transistor array substrate taken along the II–II' line of FIG. 1.

As shown in the drawings, a gate wire is formed on an insulating substrate 10 with aluminum-based low resistance metallic material. The gate wire includes a gate line 22 proceeding in the horizontal direction, a gate pad 24 connected to the gate line to receive gate signals from outside and transmit them to the gate line 22, and a gate electrode 26 connected to the gate line 22 to form a thin film transistor.

A gate insulating layer 30 is formed on the substrate 10 of silicon nitride (SiNx) while covering the gate wires. The gate insulating layer 30 has a contact hole 74 exposing the gate pad 24 together with a protective layer 70 to be formed later.

Semiconductor patterns 42 are formed on the gate insulating layer 30 over the gate electrodes 24 with amorphous silicon, and ohmic contact patterns 55 and 56 are formed on the semiconductor patterns 42 with doped amorphous silicon where suicide or conductive impurities are doped at high concentration.

A data wire is formed on the ohmic contact patterns 55 and 56, and the gate insulating layer 30 of a metallic or conductive material such as Al, Al alloy, Mo, MoW alloy, Cr and Ta. The data wire includes a data line 62 crossing over the gate line 22 to define pixel regions, a source electrode 65 branched from the data line 62 while being extended over the ohmic contact patterns 55, data pads 64 connected to the data lines 62 to receive picture signals from outside, and drain electrodes 66 separated from the source electrode 65 around the gate electrode 26 while being placed over the ohmic contact pattern 56.

The data wire may be formed with a double-layered structure. In this case, it is preferable that the one layer is formed of a low resistance material, and the other of a material bearing good contact characteristics with other material of amorphous silicon. For instance, the data wires may be formed with a lower layer 601 based on Mo, MoW alloy, Cr, Ti or Ta, and an upper layer 602 based on Al.

An intermetallic compound layer 610 is formed on the data wires to minimize the contact resistance between the data wires and pixel electrodes 82 or subsidiary data pads 86 to be formed later. The intermetallic compound layer 610 is formed of at least an aluminum-based conductive material, and another conductive material based on chrome, molybdenum or molybdenum alloy. For instance, the intermetallic compound layer 610 may be formed of Al—Mo alloy, Al—Ti alloy, Al—Ta alloy, or Al—Cr alloy.

A protective layer 70 is formed on the data wires and the semiconductor patterns 42. The protective layer 70 is formed with an organic insulating material such as acrylic resin and benzocyclo butane, or an inorganic insulating material such as silicon nitride.

The protective layer 70 has a first contact hole 72 and a third contact hole 76 exposing the intermetallic compound layer 610 on the drain electrodes 66 and the data pads 64, and second contact holes 74 exposing the gate pads 24 together with the gate insulating layer 30.

Pixel electrodes 82, and subsidiary gate and data pads 84 and 86 are formed on the protective layer 70. The pixel electrodes 82 contact the intermetallic compound layer 610 on the drain electrodes 66 through the first contact holes 72 such that they are electrically connected to the drain electrodes 66. The subsidiary gate and data pads 84 and 86 contact the intermetallic compound layer 610 on the gate pad 24 and the data pad 64 through the second contact hole 74 and the third contact hole 76.

As shown in FIGS. 1 and 2, the pixel electrodes 82 are overlapped with the gate lines 22 to form storage capacitors. In case the desired storage capacity is not obtained, storage capacitor wires may be formed on the same plane as the gate wires. Furthermore, in order to enhance aperture ratio, as shown in FIG. 1, the pixel electrodes 82 may be also overlapped with the gate lines 22 external to the thin film transistors.

In the above structure, since the gate wires and the data wires contain a low resistance aluminum-based material, the resulting thin film transistor array substrate can be well adapted for use in large-sized and high definition liquid crystal displays. Furthermore, since the data pads 64 and the drain electrodes 66 contact the subsidiary data pads 86 and the pixel electrodes 82 by interposing the intermetallic compound layer 610 while bearing minimized contact resistance, the resulting thin film transistor array substrate can serve to improve the display device performance characteristics.

A method for fabricating the above-structured thin film transistor array substrate where five masks are used in photolithography will be now explained with reference to FIGS. 3A, 3B, 4A, 4B, 5, 6A, 6B, 7A and 7B.

Figure 3A:
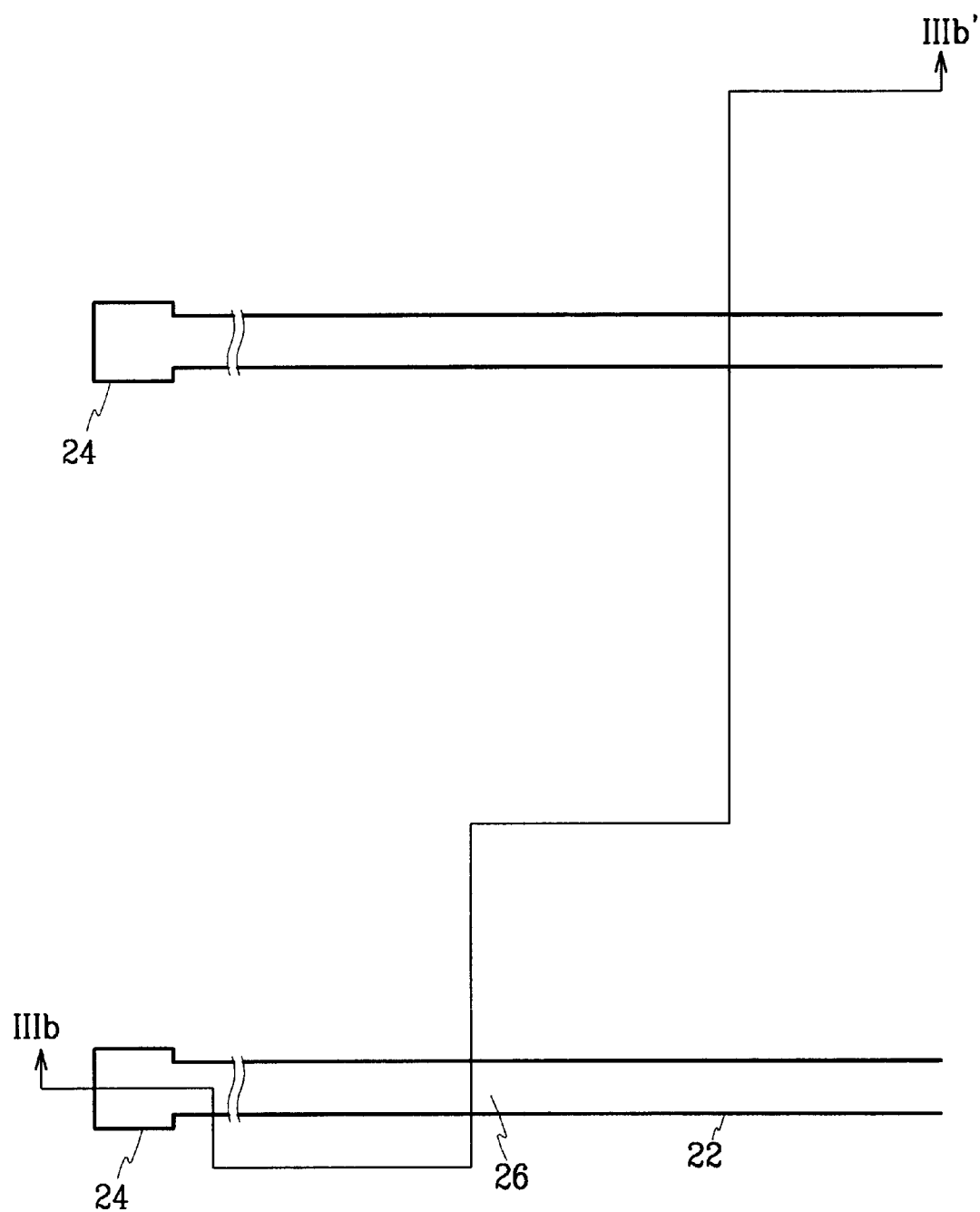
FIGS. 3A, 3B, 4A, 4B, 5, 6A, 6B, 7A and 7B sequentially illustrate the steps of fabricating the thin film transistor array substrate shown in FIG. 1.
Figure 3B:
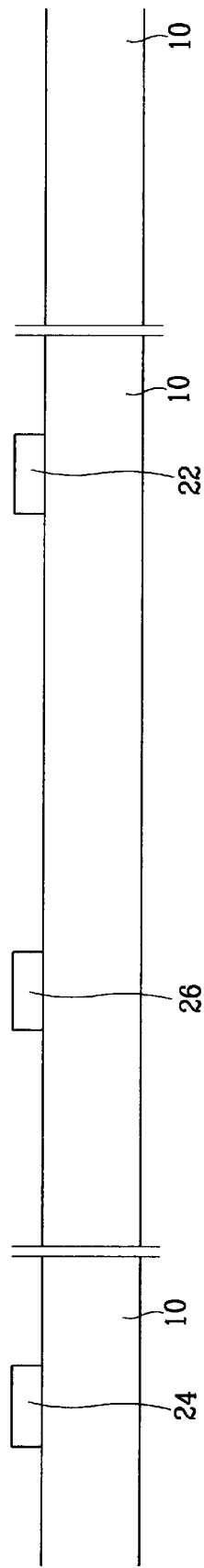

As shown in FIGS. 3A and 3B, a low resistance aluminum-based conductive layer with a thickness of about 2,500 Å is deposited on a substrate 10, and patterned to thereby form a gate wire. The gate wire include a gate line 22, a gate electrode 26, and a gate pad 24.

Figure 4A:
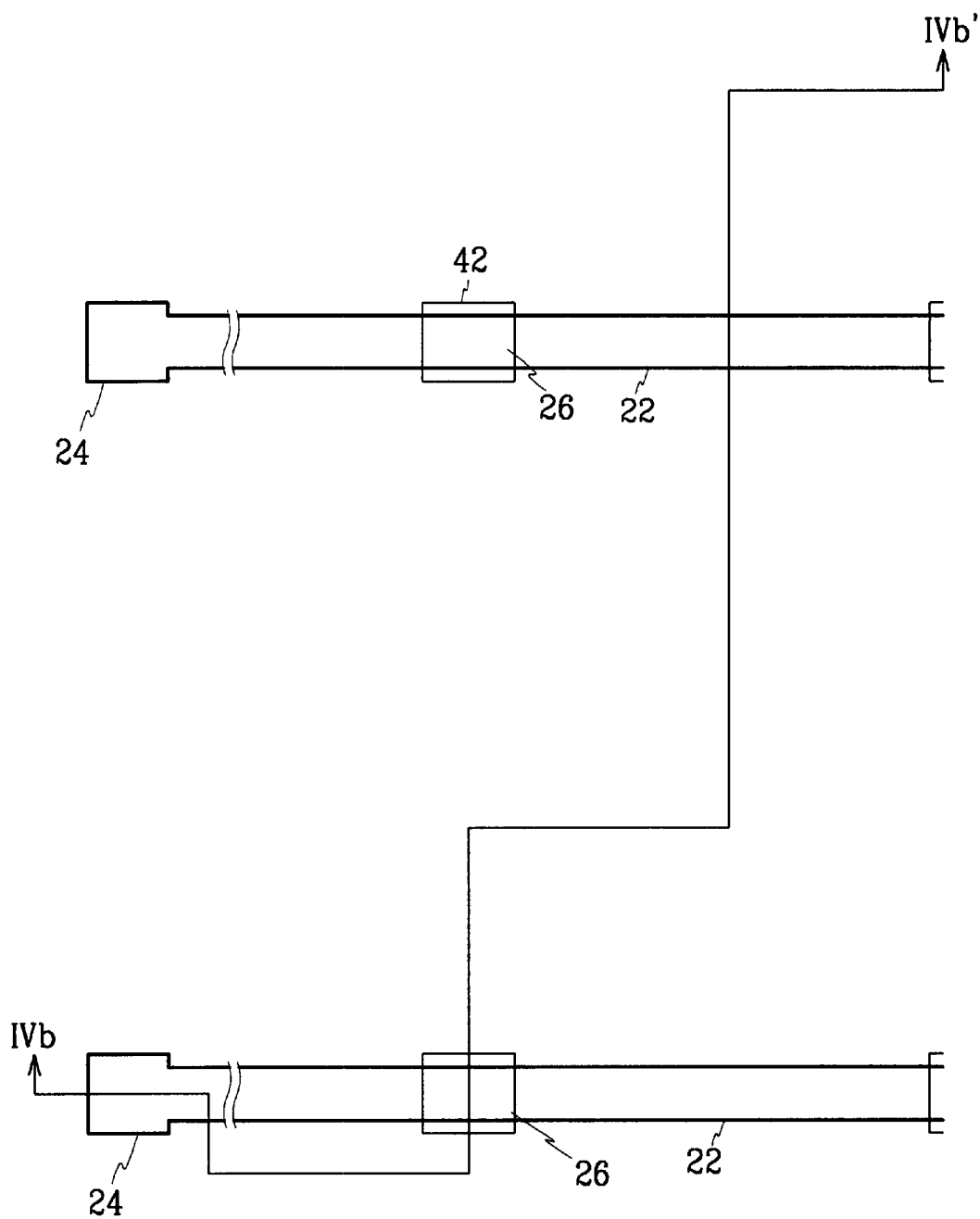
Figure 4B:
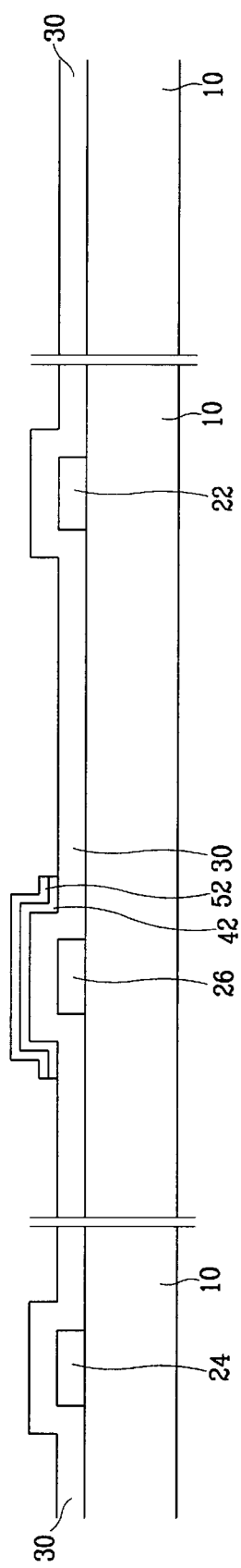

As shown in FIGS. 4A and 4B, a gate insulating layer 30, an amorphous silicon-based layer, and a doped amorphous silicon-based layer are sequentially deposited on the resultant substrate comprising the gate wire. The amorphous silicon-based layer and the doped amorphous silicon-based layer are patterned through photolithography to thereby form semiconductor patterns 42, and ohmic contact patterns 52. The semiconductor patterns 42 and the ohmic contact patterns 52 are placed on the gate insulating layer 30 over the gate electrodes 26.

Figure 5:
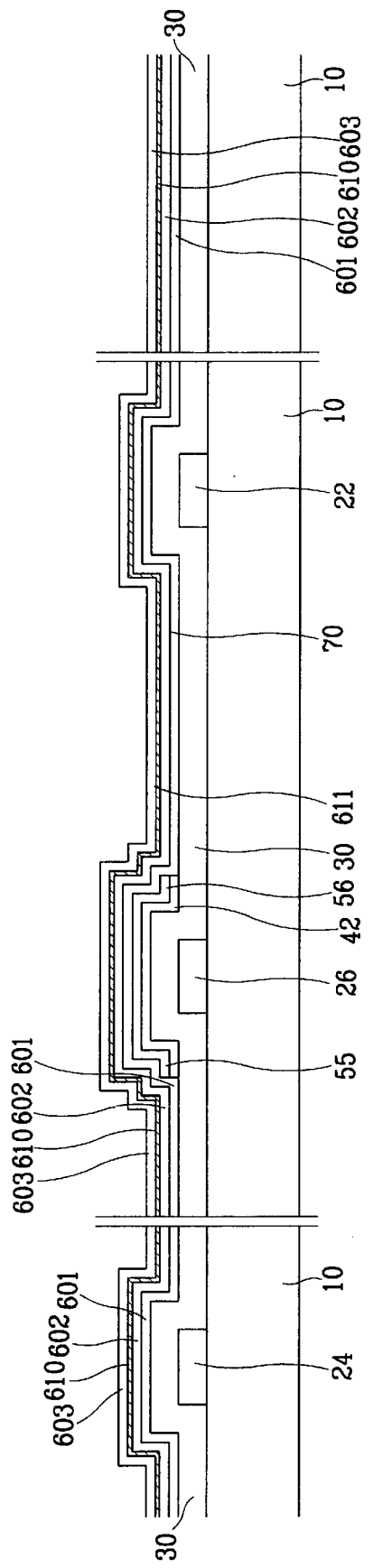

As shown in FIG. 5, a lower layer 601 with a thickness of 300 Å, an upper layer 602 with a thickness of 2500 Å, and a buffer layer 603 are sequentially deposited on the resultant substrate comprising the semiconductor patterns 42 and the ohmic contact patterns 52 under the vacuum atmosphere. The lower layer 601 is formed of a material based on Mo, Cr, Ti, or Ta, and the upper layer 602 of a low resistance material based on Al. The buffer layer is formed of a material based on Mo, Cr, Ti, or Ta. As the buffer layer 603 is directly deposited on the upper-layer 602 in the same vacuum state, it becomes possible to prevent a high resistance $Al_2O_3$-based layer from forming on the aluminum-based upper layer 602 under the air atmosphere. Such a high resistance layer may cause the contact resistance of the contact portions where the aluminum-based upper layer 602 comes in contact with other material layers.

The substrate is then annealed to form an intermetallic compound layer 610 between the upper layer 602 and the buffer layer 603. At this time, the intermetallic compound layer 610 at least contains the material constituents of the buffer layer 603. The intermetallic compound layer 610 may be formed of constituents of upper layer 602 and constituents of the buffer layer 603. For instance, the intermetallic compound layer 610 may be formed with Al—Mo alloy, Al—Ti alloy, Al—Ta alloy, or Al—Cr alloy. Of course, such an intermetallic compound layer may be formed on the gate wires by depositing a buffer layer on the gate wire and annealing like the above intermetallic compound layer on the data wires.

Figure 6A:
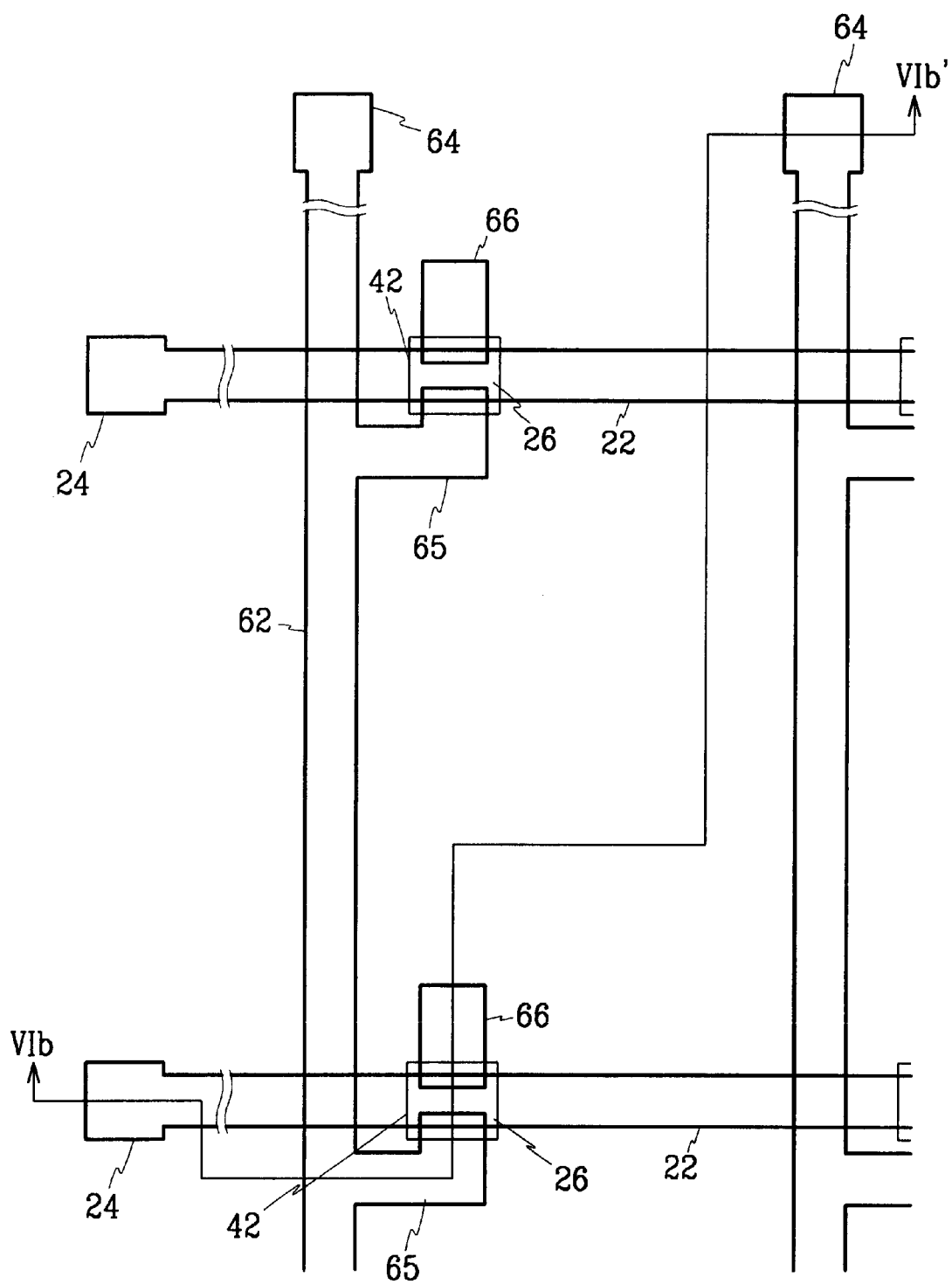
Figure 6B:
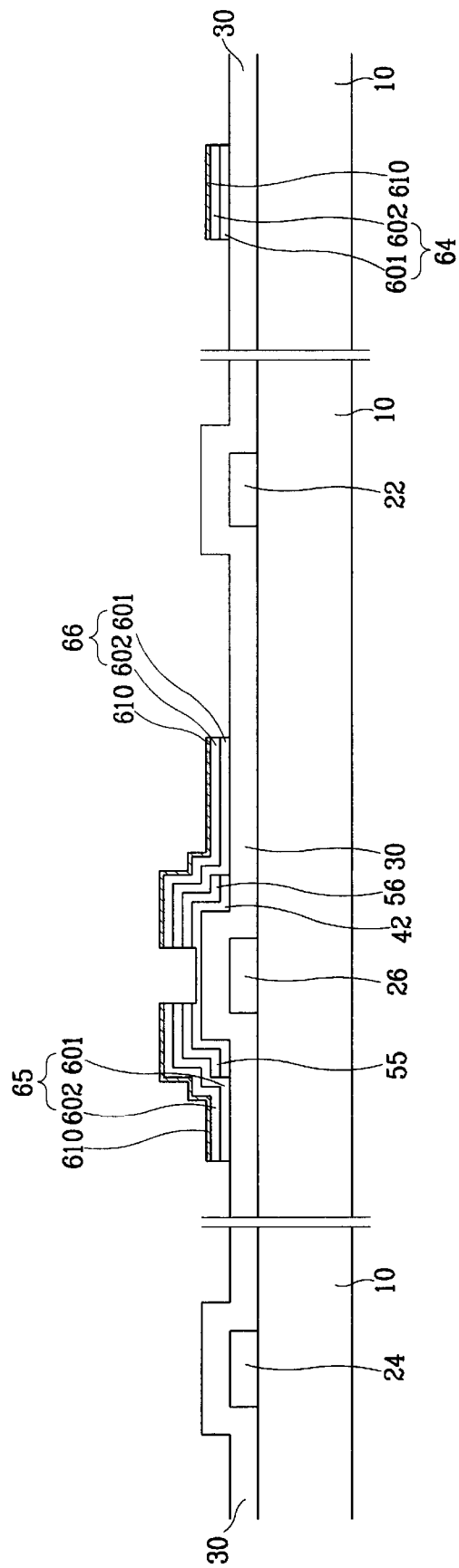

As shown in FIGS. 6A and 6B, the buffer layer 603 is removed, and the upper layer 602 and the lower layer 601 are patterned through photolithography to thereby form a data wire. The data wire include a data line 62 crossing over the gate line 22, source electrode 65 connected to the data line 62 while being extended over the gate electrode 26, and drain electrode 66 separated from the source electrode 65 around the gate electrode 26. The upper layer 602 and the lower layer 601 are patterned through wet etching. Alternatively, the upper layer 602 may be patterned through wet etching while the lower layer 601 is patterned through dry etching.

When the buffer layer 603 is removed, the intermetallic compound layer 610 remains on the data wire.

Thereafter, the ohmic contact patterns 52 exposed through the data wire is etched into two ohmic contact patterns 55 and 56 exposing the underlying semiconductor patterns 42. The two ohmic contact patterns 55 and 56 are spaced apart from each other around the gate electrode 26 with a predetermined distance. At this time, oxygen plasma is performed to stabilize the exposed surface of the semiconductor patterns 42.

Figure 7A:
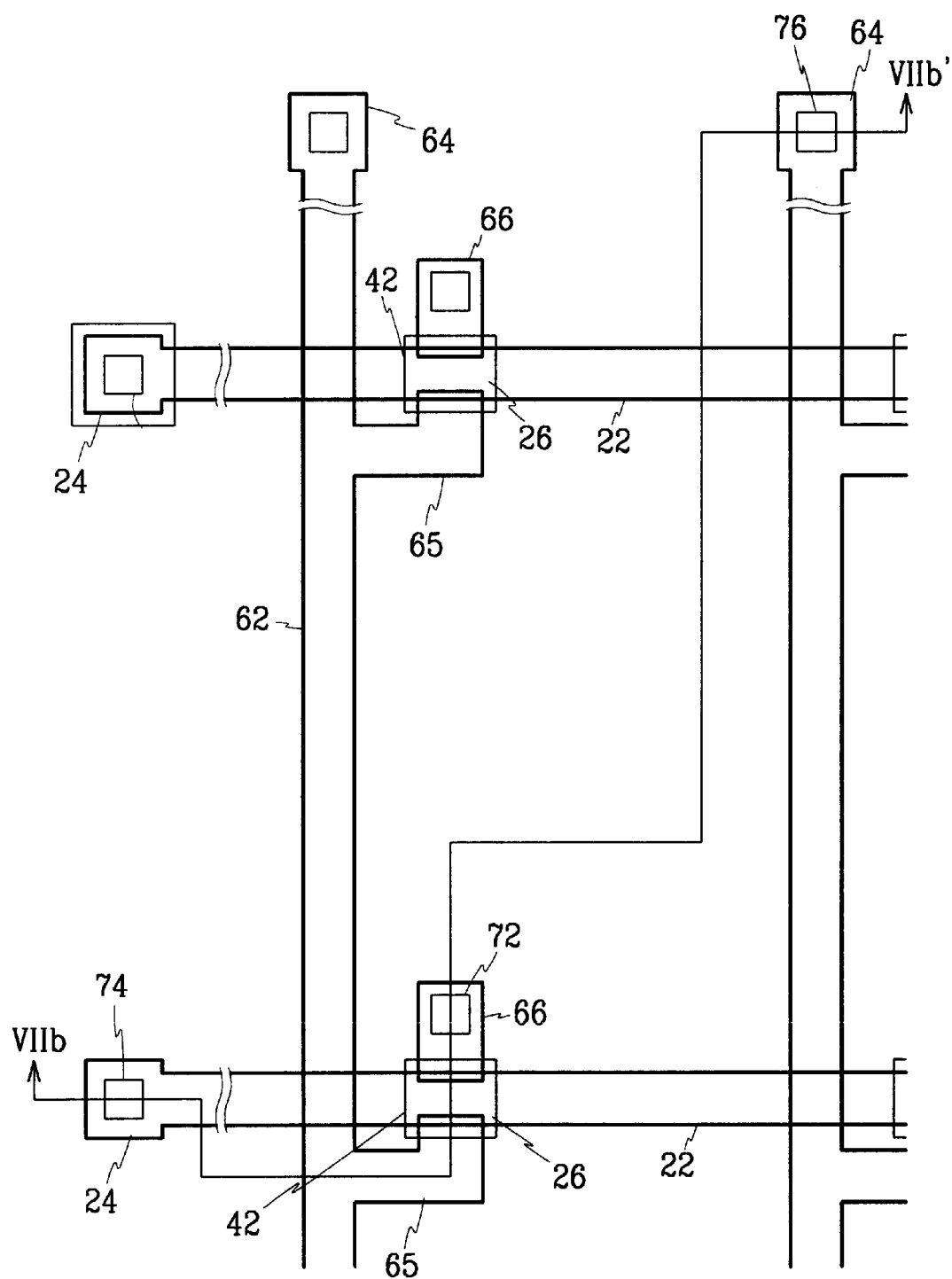
Figure 7B:
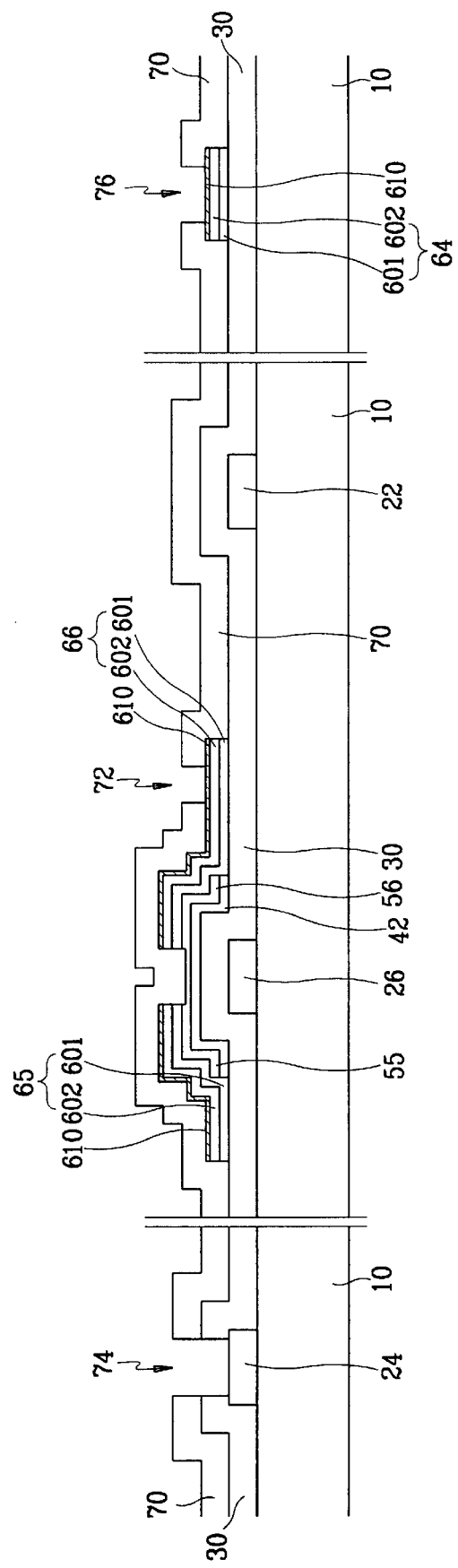

As shown in FIGS. 7A and 7B, a protective layer 70 is formed on the data wires and the semiconductor patterns 42 with an insulating material. The protective layer 70 may be formed with organic insulating material, or silicon nitride. Alternatively, the protective layer 70 may bear a multiple-layered structure an organic insulating material-based layer and a silicon nitride-based layer.

The protective layer 70 and the gate insulating layer 30 are etched through photolithography to thereby form a first contact hole 72 exposing the drain electrode 66, a second contact hole 74 exposing the gate pad 24 and a third contact hole 76 exposing the data pad 64.

In case the protective layer 70 is formed of a photosensitive organic insulating material, the first contact hole 72, the second contact hole 74 and the third contact hole 76 may be formed only by exposing the protective layer 70 to light, and developing it. In this case, the gate insulating layer 30 is etched using the etched protective layer 70 as a mask to form the second contact hole 74.

Meanwhile, in case the protective layer 70 is formed silicon nitride, the protective layer 70 is etched using a mixture of $SF_6$ and $Cl_2$. The etching is preferably made for a sufficiently long period of time such that the gate insulating layer 30 is etched together to thereby form the second contact hole exposing the gate pad 24.

Like the above, when the protective layer 70 and the gate insulating layer 30 over the gate pad 24 are etched, the protective layer 70 over the drain electrode 66 and the data pad 64 is etched to form the first contact hole 72, the second contact hole 74 and the third contact hole 76 while exposing the intermetallic compound layer 610 on the drain electrode 66 and the data pad 64.

Finally, as shown in FIGS. 1 and 2, an IZO-based layer is deposited on the resultant substrate comprising the protective layer 70 and contact holes 72, 74, 76. And, the an IZO-based layer is patterned through photolithography to form a pixel electrode 82 and a subsidiary data pad 84 electrically connecting the drain electrode 66 and the data pad 64 by contacting the intermetallic compound layer 610 on the drain electrode 66 and the data pad 64 through the contact holes 72 and 76, respectively, and subsidiary gate pad 84 contacting the gate pad 24 through the contact hole 74.

In the above method, as the upper layer 602 of the data wire and the buffer layer 603 are sequentially deposited on the resultant substrate comprising the semiconductor patterns 42 and the ohmic contact patterns 52 under the vacuum atmosphere, a high resistance aluminum oxide layer is not formed on the aluminum-based upper layer while making the overall processing steps to be performed in a stable manner. Furthermore, the intermetallic compound layer 610 can minimize the contact resistance between the IZO-based layer and the aluminum-based layer at the contact area.

Figure 8:
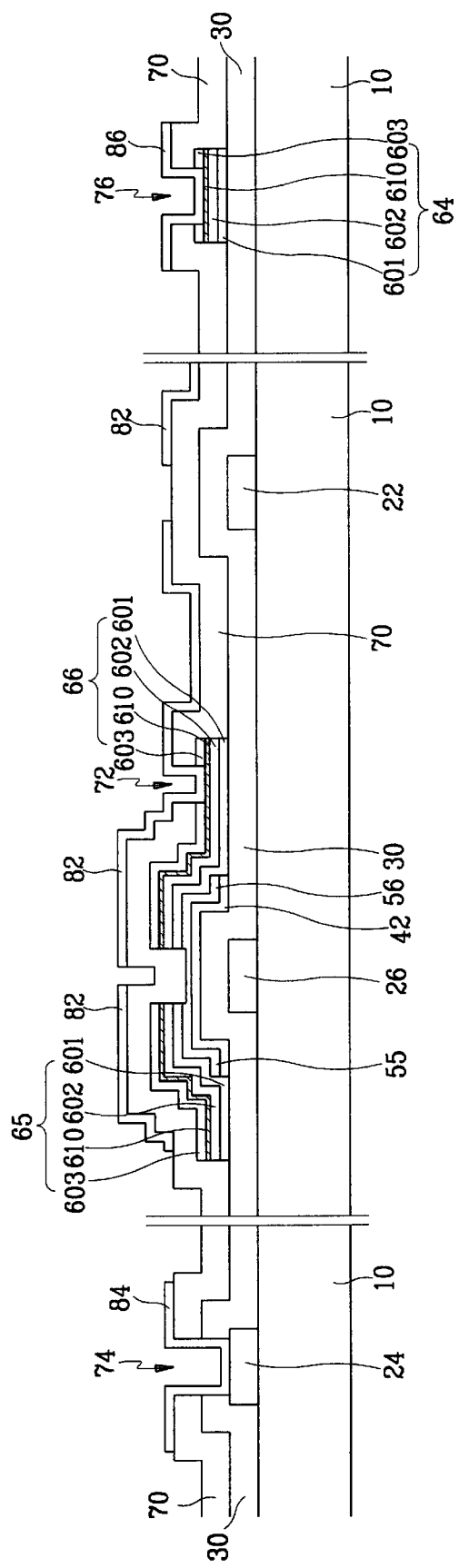
FIG. 8 is another cross sectional view of the thin film transistor array substrate taken along the II–II' line of FIG. 1.

In the meantime, it is possible that the buffer layer 603 is not removed from the aluminum-based upper layer 602, but used for the data wires together with the intermetallic compound layer 610. This structure is illustrated in FIG. 8. For this purpose, the following intermediary processing steps may be introduced.

Again, as shown in FIG. 5, a lower layer 601, an aluminum-based upper layer 602, and a buffer layer 603 are sequentially deposited on the resultant substrate comprising the gate insulating layer 30 and the semiconductor patterns 42. At this time, the buffer layer 603 is deposited at 150° C. or higher such that an intermetallic compound layer 610 is formed between the upper layer 602 and the buffer layer 603 while containing the material constituents of the upper layer 602 and the material constituent of the buffer layer 603. For instance, the intermetallic compound layer 610 may be formed of Al—Mo alloy, Al—Ti alloy, Al—Ta alloy, or Al—Cr alloy. The buffer layer 603 may be formed of metallic materials capable of forming a compound in reaction with aluminum at 150° C. or higher. In this case, the annealing process for forming the intermetallic compound layer 610 may be omitted.

The thickness of the intermetallic compound layer 610 is determined depending upon the degree of temperature and the period of time for the deposition of the buffer layer 603, which should be controlled in an appropriate manner. The thickness of the buffer layer 603 is established such that an intermetallic compound layer 610 can be formed between the buffer layer 603 and the upper layer 602. For example, when it is intended to make the intermetallic compound layer 610 bear a thickness of 10 Å or more, the buffer layer 603 should be established to have a thickness of 50 Å or more.

Thereafter, instead of removing the buffer layer 603, the multiple-layered structure of the buffer layer 603, the intermetallic compound layer 610, the upper layer 602 and the lower layer 601 is patterned through photolithography to thereby form a multiple-layered data wires shown in FIG. 8.

Then, after forming a protective layer 70, the first contact hole 72, the second contact hole 74, and the third contact hole are formed at the protective layer 70 and the gate insulating layer. Subsequently, the pixel electrode 82, the subsidiary gate pad 84 and the subsidiary data pad are formed at the substrate 10.

In case the buffer layer 603 is formed of a molybdenum-based material that is well etched by the etching gas for silicon nitride, the buffer layer 603 is liable to be etched during the step of etching the protective layer 70 or the gate insulating layer 30 to expose the underlying intermetallic compound layer. In this case, the intermetallic compound layer covers the lower layer 602 to prevent an oxide layer from forming on the surface thereof.

Meanwhile, in case the intermetallic compound layer 610 is exposed to the air atmosphere, it is liable to be oxidized under the air atmosphere. However, since the intermetallic compound layer 610 bears reliable conductive characteristic, it does not affect the contact characteristic between the upper layer 602 and the IZO-based layer. In this way, the first contact hole 72 are formed in the protective layer 70 and the buffer layer 603 of the drain electrode 66 to expose the intermetallic compound layer 610 of the drain electrode 66, and the third contact holes 76 are formed in the protective layer 70 and the buffer layer 603 of the data pads 64 to expose the intermetallic compound layer 610 of the data pads 64. Consequently, the IZO-based layer for the pixel electrodes 82 and the subsidiary data pads 86 can contact the aluminum-based layer for the drain electrodes 66 and the data pads 64 via the intermetallic compound layer 610 in a stable manner while exhibiting lower contact resistance.

Furthermore, it is also possible that the first and third contact holes 72 and 76 are formed only in the protective layer 70, and the pixel electrodes 82 and the subsidiary data pads 86 directly contact the buffer layer 603 of the drain electrodes 66 and the data pads 64.

In the above method, the contact resistance between the IZO-based layer for the pixel electrodes 82 and the subsidiary data pads 84 and the aluminum-based layer for the drain electrodes 66 and the data pads 64 can be sufficiently reduced. Furthermore, even without a separate high temperature annealing process, an intermetallic compound layer for reducing the contact resistance between the IZO-based layer and the aluminum-based layer can be formed in a stable manner, simplifying the processing procedures.

Figure 9:
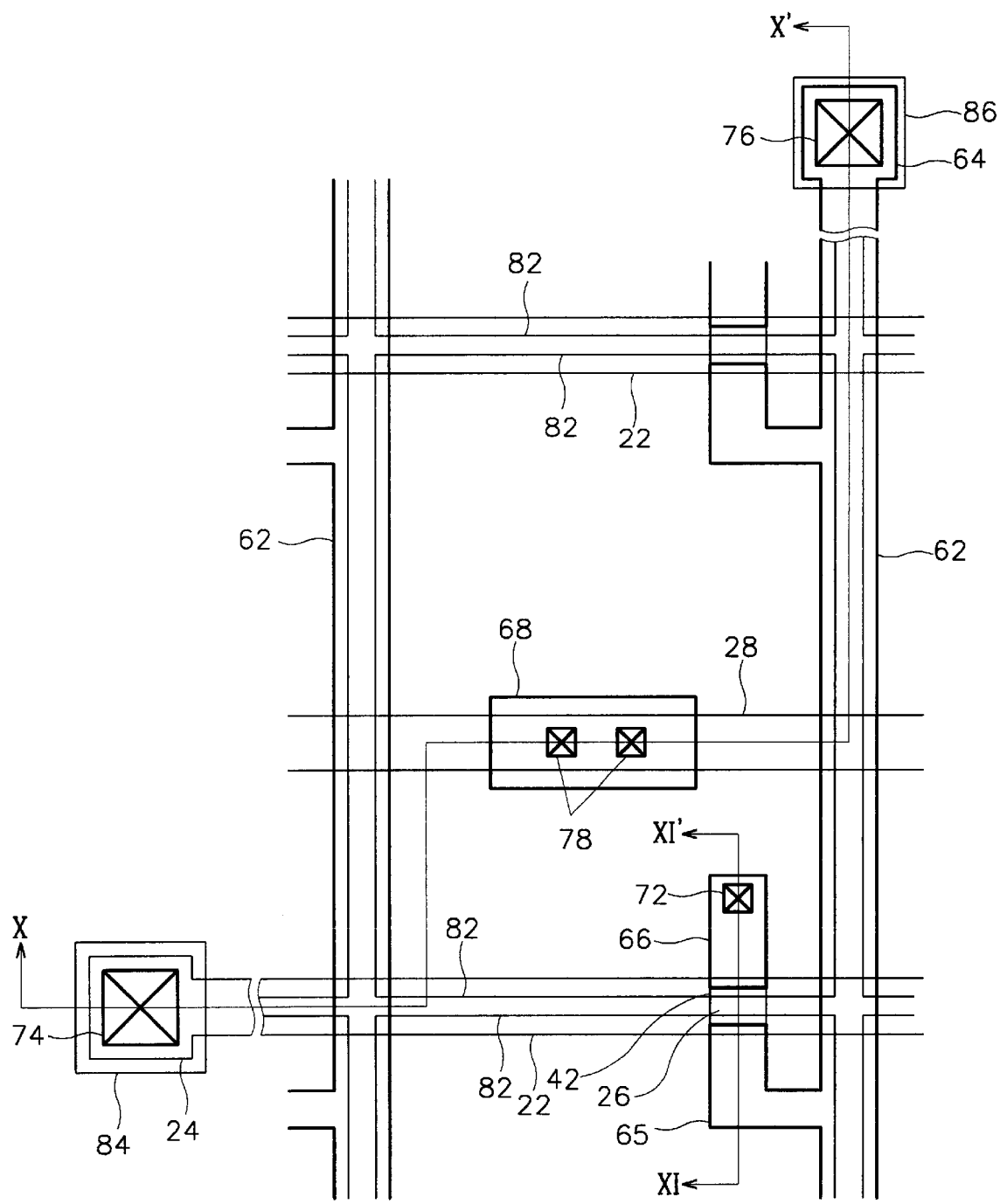
FIG. 9 is a plan view of a thin film transistor array substrate for a liquid crystal display according to a second preferred embodiment of the present invention.

FIG. 9 is a plan view of a thin film transistor array substrate according to a second preferred embodiment of the present invention. 10 and 11 are cross sectional views taken along the X–X' line and the XI–XI' line of FIG. 9, respectively.

Like the thin film transistor array substrate according to the first preferred embodiment, an aluminum-based gate wire is formed on an insulating substrate 10. The gate wire includes a gate line 22, a gate pad 24, and a gate electrode 26. The gate wire further includes a storage capacitor electrode 28 proceeding in parallel with the gate line 22 to receive common voltages from the outside. The storage capacitor electrode 28 is overlapped with a storage capacitor conductive pattern 68 connected to the pixel electrode 82 to form storage capacitors for improving electric potential storage capacity of the pixels. In case a sufficient amount of storage capacity is obtained by overlapping of the pixel electrodes 82 and the gate lines 22, the storage capacitor electrodes 28 may be omitted.

A gate insulating layer 30 is formed on the gate wire with silicon nitride (SiNx) to cover the gate wire.

Semiconductor patterns 42 and 48 are formed on the gate insulating layer 30 of amorphous silicon. Ohmic contact patterns 55, 56 and 58 are formed on the semiconductor patterns 42 and 48 of doped amorphous silicon where conductive impurities of phosphorous are doped at high concentration.

Data wires are formed on the ohmic contact patterns 55, 56 and 58 with a low resistance aluminum-based material. The data wire includes a data line 62, a data pad 64 connected to the data line 62 to receive picture signals from the outside, a source electrode 65 branched from the data line 62 to form a thin film transistor, a drain electrode 66 positioned opposite to the source electrode 65 around the gate electrode 26, and a storage capacitor conductive pattern 68 placed over the storage capacitor electrode 28. In the absence of the storage capacitor electrode 28, the storage capacitor conductive pattern 68 are also omitted.

The data wire may bear a single-layered structure, or a multiple-layered structure. In case the data wires bears a double-layered structure, one layer may be formed of a low resistance material while the other layer of a material exhibiting good contact characteristics with other materials. For instance, the data wires may be formed of a lower layer based on Mo, MoW alloy, Cr, Ti, or Ta, and an upper layer based on Al.

The ohmic contact patterns 55, 56 and 58 lower the contact resistance between the underlying semiconductor patterns 42 and 48 and bear the same shape as the data wires. That is, the first portions 55 of the ohmic contact patterns have the same shape as the data lines 62, the data pads 64 and the source electrodes 65, the second portions 56 of the ohmic contact patterns have the same shape as the drain electrodes 66, and the third portions 58 of the ohmic contact patterns have the same shape as the storage capacitor conductive patterns 68.

Meanwhile, the semiconductor patterns 42 and 48 have the same shape as the data wires and the ohmic contact patterns 55, 56 and 58 except for the channel portions C that will be explained later referring to FIG. 16B. That is, the storage capacitor semiconductor pattern 48, the storage capacitor conductive pattern 68 and the storage capacitor ohmic contact pattern 58 have the same shape, but the semiconductor pattern for thin film transistor 42 slightly differ from the data wire and the ohmic contact pattern. The source and drain electrodes 65 and 66 as well as the first and second ohmic contact patterns portions 55 and 56 are separated from each other at the channel portions C, but the semiconductor patterns for thin film transistor 42 continuously proceed there to form a thin film transistor channel.

An intermetallic compound layer 610 is formed on the data wire to minimize the contact resistance between the data wire and an IZO-based layer for pixel electrodes 82 or subsidiary data pads 86. The intermetallic compound layer 610 is formed of at least an aluminum-based material, and another metallic material such as Cr, Mo, or Mo alloy. For instance, the intermetallic compound layer 610 may be formed of Al—Mo alloy, Al—Ti alloy, Al—Ta alloy, or Al—Cr alloy.

A protective layer 70 is formed on the data wire, and the semiconductor pattern 42. The protective layer 70 is formed of an organic insulating material such as acrylic resin or benzocyclo butane (BCB), or an inorganic insulating material such as silicon nitride.

The protective layer 70 has a first contact hole 72, a third contact hole 76 and a fourth contact hole 78 exposing the drain electrode 66, the data pad 64 and the storage capacitor conductive pattern 68, respectively. The protective layer 70 further has a second contact hole 74 exposing the gate pad 24 through the gate insulating layer 30.

The intermetallic compound layer 610 on the drain electrode 66, the data pad 64 and the storage capacitor conductive pattern 68 are exposed through the first, third and fourth contact holes 72, 76 and 78.

Pixel electrodes 82 are formed on the protective layer 70 to receive picture signals from thin film transistors and generate electric fields in association with a common electrode formed on a color filter substrate. The pixel electrodes 82 are formed with a transparent conductive material such as indium zinc oxide (IZO), and electrically connected to the drain electrodes 66 via the intermetallic compound layer 610 through the first contact hole 72 to receive picture signals. The pixel electrodes 82 overlap the neighboring gate line 22 and data line 62 to enhance aperture ratio, but the overlapping may be omitted. Furthermore, the pixel electrodes 82 are electrically connected to the storage capacitor conductive patterns 68 through the fourth contact holes 78 to transmit picture signals to the conductive patterns 68. Subsidiary gate and data pads 84 and 86 are connected to the gate and data pads 24 and 64 through the second and third contact holes 74 and 76 to compensate for adhesion between the pads 24 and 68 and external circuits, and protect them. The use of the subsidiary gate and data pads 84 and 86 is not necessary, but selectively made.

In reflection type liquid crystal displays, the pixel electrodes 82 may be formed of an opaque conductive material.

In the above structure, since the gate wire and the data wire contain the aluminum-based material, it can be well adapted for large size and high definition liquid crystal displays. Furthermore, since the data pads 64 and the drain electrodes 66 contact the IZO-based subsidiary data pads 86 and pixel electrodes 82 by interposing the intermetallic compound layer 610 for minimizing the contact resistance, the resulting thin film transistor array substrate can improve the display device performance characteristics.

A method for fabricating the thin film transistor array substrate where four masks are used will be now explained with reference to FIGS. 12A, 12B, 12C, 13A, 13B, 13C, 14A, 14B, 15A, 15B, 16A, 16B, 17A, 17B, 18A, 18B, 19A, 19B, 20A, 20B and 20C.

Figure 12A:
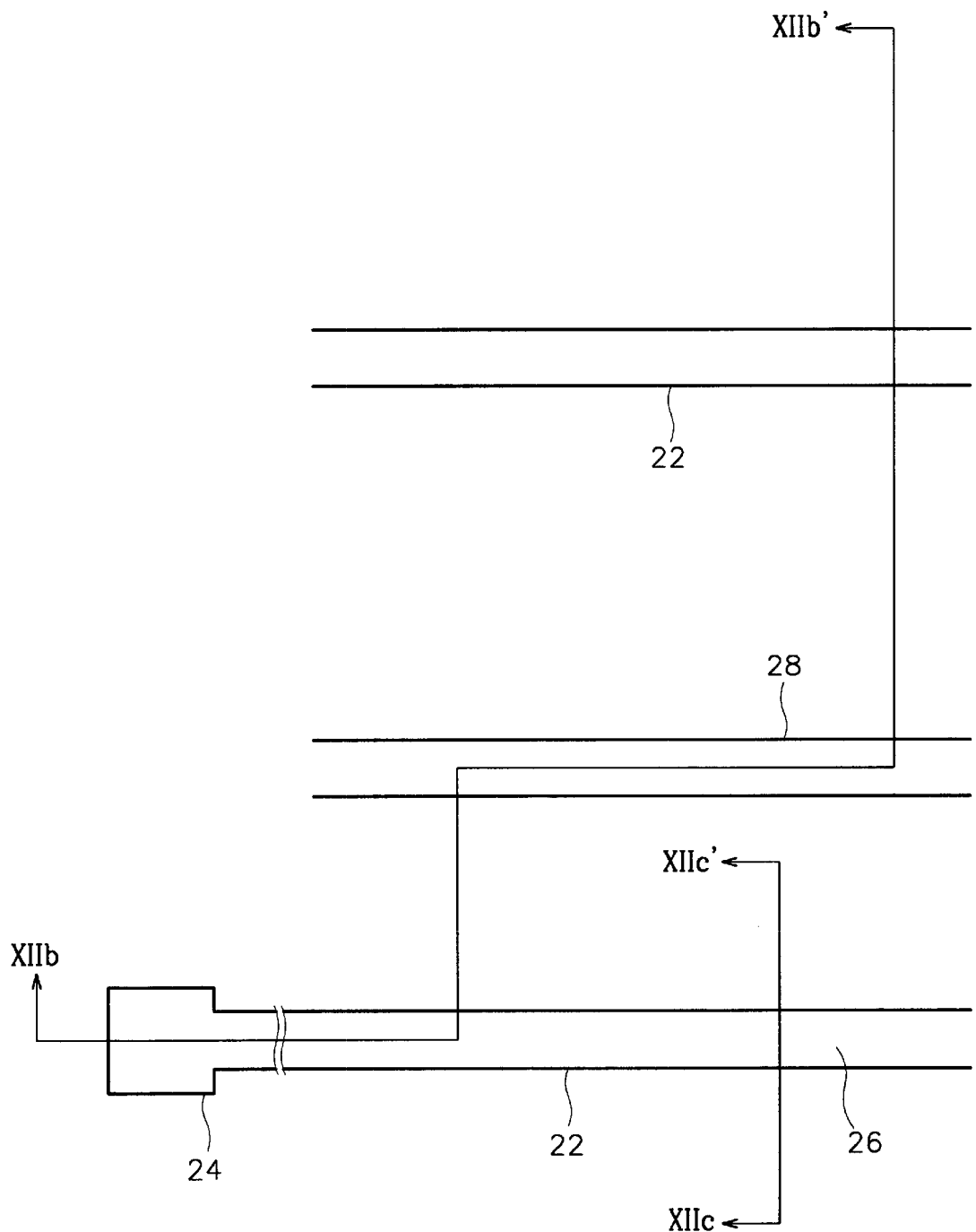
Figure 12B:
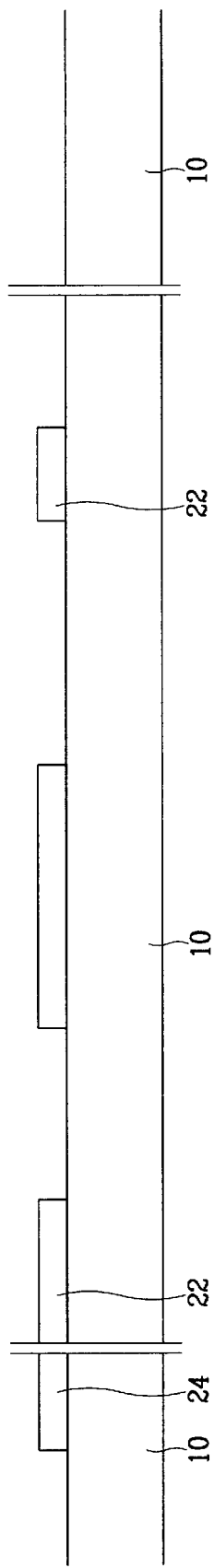
Figure 12C:
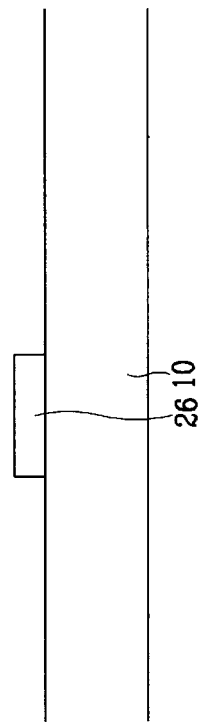

As shown in FIGS. 12A, 12B and 12C, a low resistance aluminum-based layer is deposited on a substrate 10, and patterned through photolithography using a first mask to thereby form a gate wire. The gate wire include a gate line 22, a gate pad 24, a gate electrode 26, and a storage capacitor electrode 28.

Figure 13A:
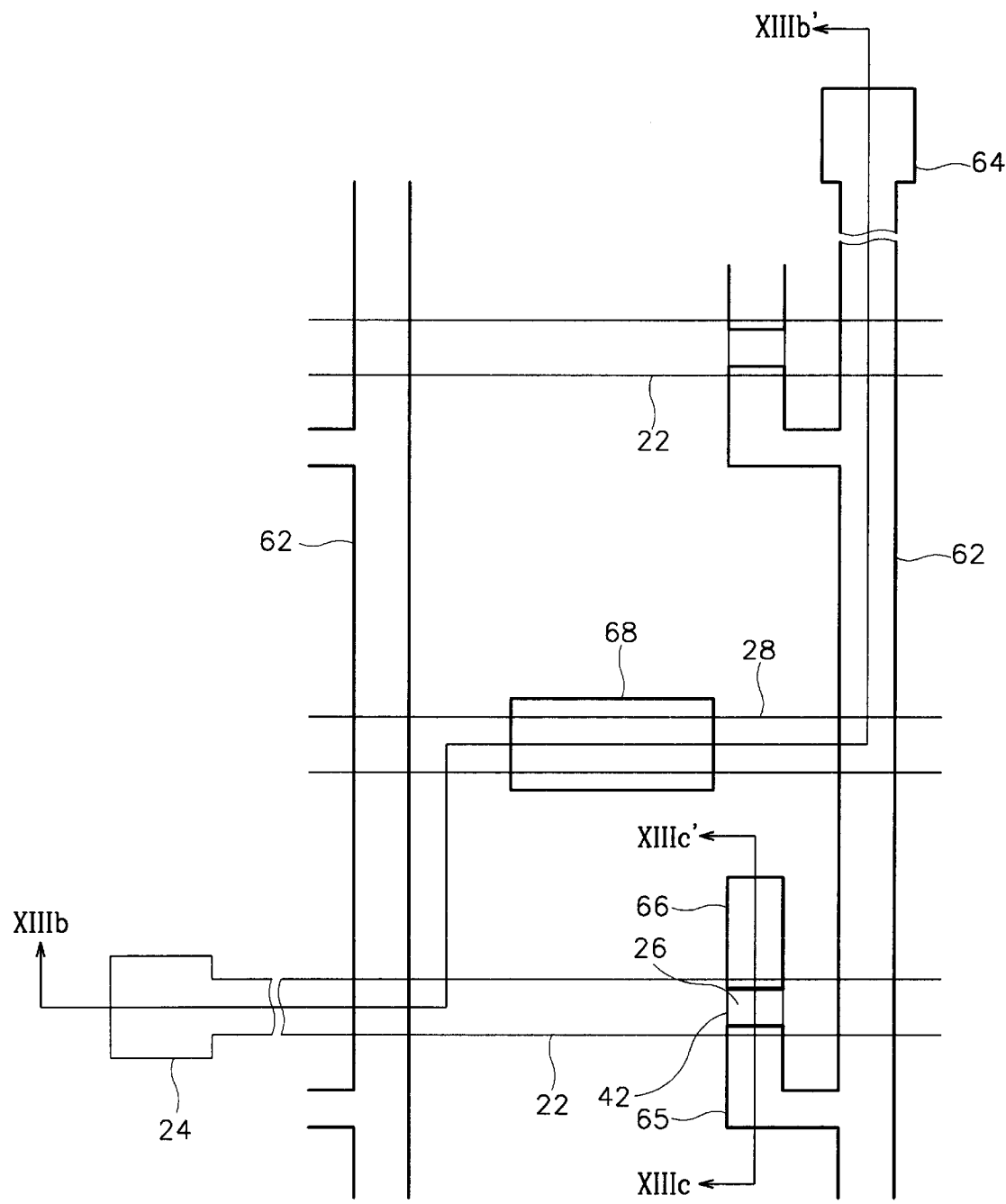
Figure 13B:
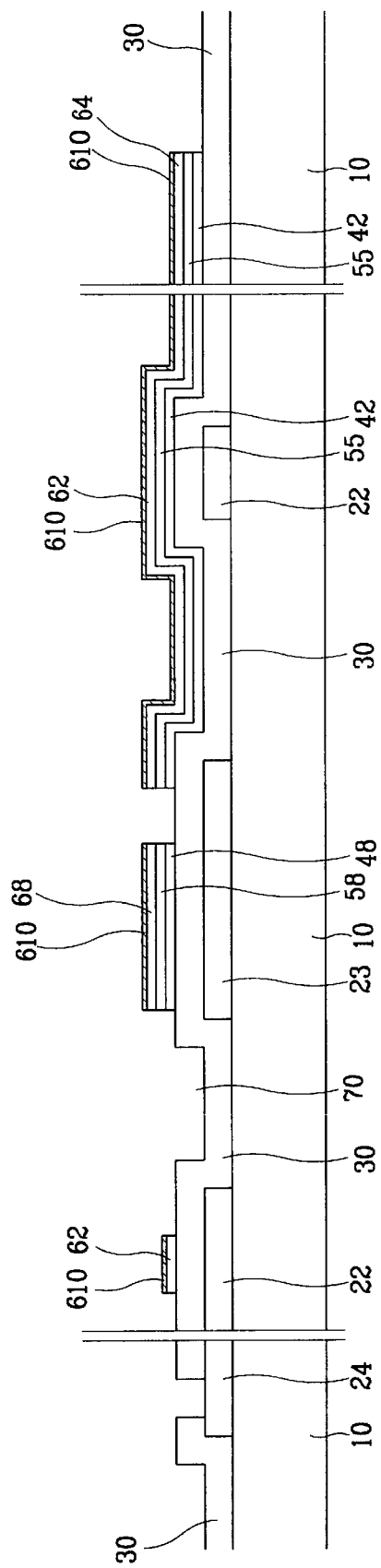
Figure 13C:
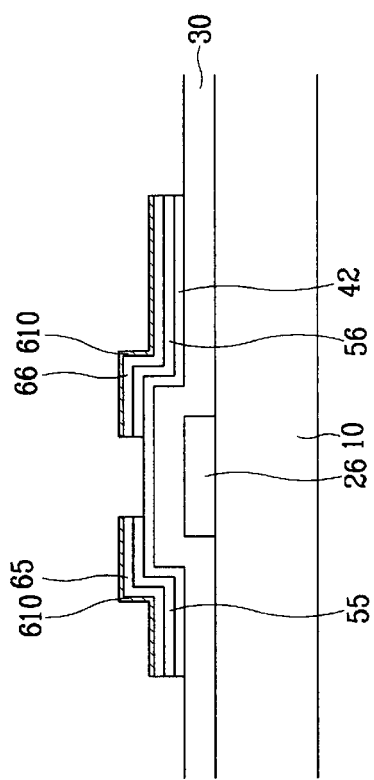

As shown in FIGS. 13A, 13B and 13C, a gate insulating layer 30 is formed on the resultant substrate comprising the gate wire, and semiconductor patterns 42 and 48, ohmic contact patterns 55, 56 and 58, and a multiple-layered data wires are formed on the gate insulating layer 30. The data wire include a data line 62, a data pad 64, a source electrode 65, a drain electrode 66, and a storage capacitor electrode 68.

The ohmic contact patterns 55, 56 and 58 contact the bottom surface of the data wires with the same shape, and the semiconductor patterns 42 and 48 for the thin film transistors and the storage capacitors contact the bottom surface of the ohmic contact patterns 55, 56 and 58. The thin film transistor semiconductor patterns 42 have the same shape as the data line 62, the data pad 64, the source electrode 65 and the drain electrode 66, but further include the channel portions between the source electrode 65 and the drain electrode 66.

The data wire, the ohmic contact patterns 55, 56 and 58, and the semiconductor patterns 42 and 48 may be formed only using one mask. This technique will be now explained with reference to 14A, 14B, 15A, 15B, 16A, 16B, 17A, 17B, 18A, 18B, 19A and 19B.

As shown in FIGS. 14A and 14B, a gate insulating layer 30 with a thickness of 1500–5000 Å, a semiconductor layer 40 with a thickness of 500–2000 Å, and an impurity-doped amorphous silicon-based layer 50 with a thickness of 300–600 Å are sequentially deposited on the resultant substrate comprising the gate wires through chemical vapor deposition. Thereafter, a low resistance aluminum-based conductive layer 602, and a buffer layer 603 based on Mo, Cr, Ti or Ta are sequentially deposited on the doped amorphous silicon-based layer 50 through sputtering. At this time, the deposition of the buffer layer 603 is continuously made under the same vacuum state.

As the buffer layer 603 is continuously deposited on the conductive layer 602 under the vacuum atmosphere, a high resistance $Al_2O_3$-based layer that increases the contact resistance at the contact portions is prevented from forming on the conductive layer 602.

An intermetallic compound layer 610 is then formed between the conductive layer 602 and the buffer layer 603 by an annealing process. The intermetallic compound layer 610 at least contains the material constituents of the buffer layer 603. The intermetallic compound layer 610 may be formed of the material constituents of the conductive layer 602 and the material constituents of the buffer layer 603. For example, the intermetallic compound layer 610 may be formed of Al—Mo alloy, Al—Ti alloy, Al—Ta alloy, or Al—Cr alloy.

Figure 15A:
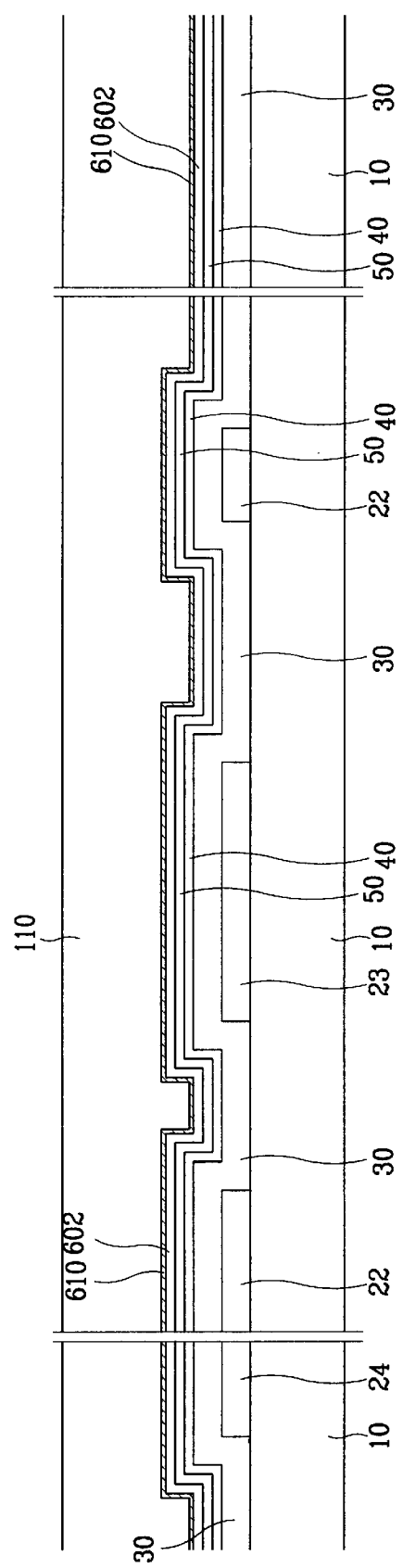
Figure 15B:
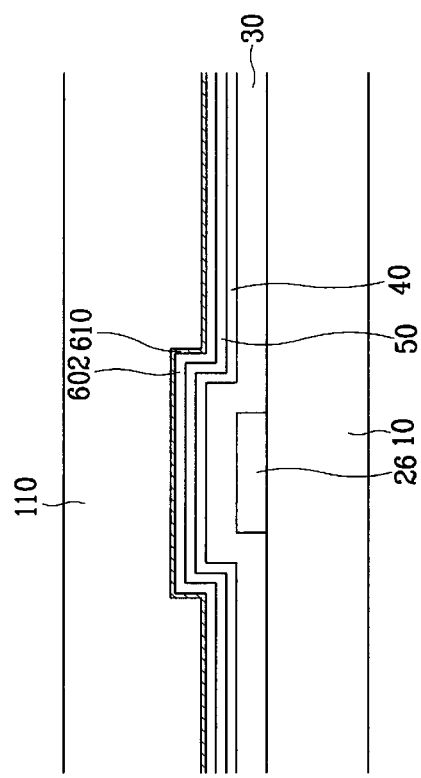

As shown in FIGS. 15A and 15B, the buffer layer 603 is removed while exposing the intermetallic compound layer 610. When the buffer layer 603 is removed, it is preferable that the intermetallic compound layer 610 not be removed, but remain on the conductive layer 602.

A photoresist film 110 is coated on the intermetallic compound layer 610 to a thickness of 1–2 μm.

Figure 16A:
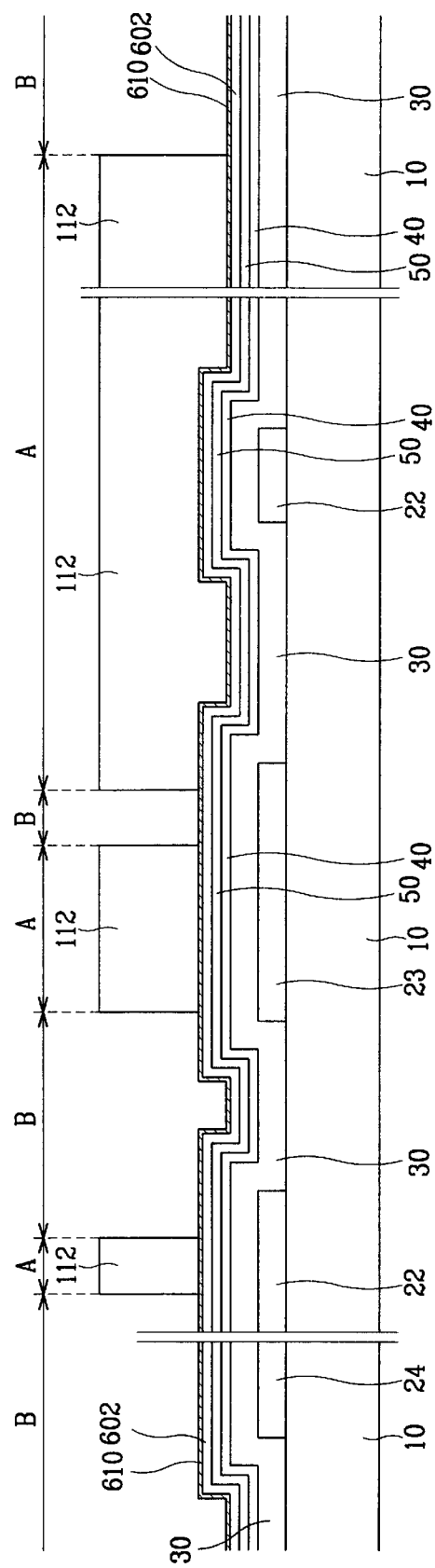
Figure 16B:
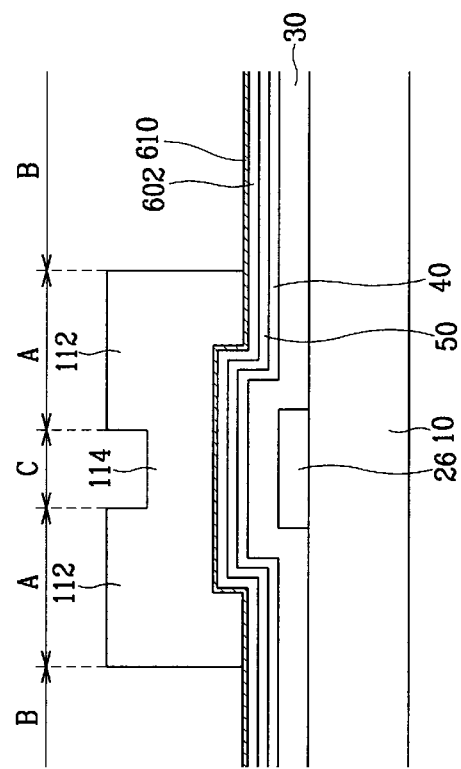

As shown in FIGS. 16A and 16B, the photoresist film 110 is selectively exposed to light, and developed to thereby form a photoresist pattern with a first portion 112 and a second portion 114 of different thickness. The first photoresist pattern portion 112 is placed at the data wire area A where data wires are formed, and the second photoresist pattern portion 114 is placed at the channel area C between the source electrode 65 and the drain electrode 66. The first photoresist pattern portion 112 is established to be thicker than the second photoresist pattern portion 114. The photoresist film 110 at the remaining area B is all removed. The thickness ratio of the second photoresist pattern portion 114 to the first photoresist pattern portion 112 depends upon the etching conditions. It is preferable that the thickness ratio of the second photoresist pattern portion 114 to the first photoresist pattern portion 112 is established to be ½ or less. For example, the second photoresist pattern portion 114 may be 4000 Å or less thick.

A slit or lattice pattern, or a semitransparent film may be used to differentiate the thickness of the photoresist pattern.

The slit or opening width is established to be smaller than the resolution of the light exposing device. In case a semitransparent film is used to control light transmission, thin films of different light transmission or in thickness may be used for that purpose.

With illumination of light through such a mask, the molecules at the portion of the photoresist film directly exposed to light are completely decomposed, the molecules at the slit patterned or semitransparent film portion of the photoresist film are decomposed to some degree, and the molecules at the light interception film portion are barely decomposed. When the photoresist film is developed, the thickness of the developed film becomes different depending upon the decomposition degree. If the light exposure time is too long, all of the molecules may be decomposed. Thus, the light exposure time should be controlled in an appropriate manner.

The second photoresist pattern portion 114 with a slight thickness may be formed using a photoresist film capable of reflowing. The photoresist film is exposed to light through a usual mask with a transparent portion and an opaque portion, and developed. The remaining photoresist film is then partially reflown into the non-film portion.

The conductive layer 602, the doped amorphous silicon-based layer 50, and the semiconductor layer 40 are etched through the first and second photoresist pattern portions 112 and 114. At this time, the data wires and the underlying layers should be left over at the data wires area A. Only the semiconductor layer 40 at the channel area C remains and the gate insulating layer 30 is exposed at the remaining area B.

Figure 17A:
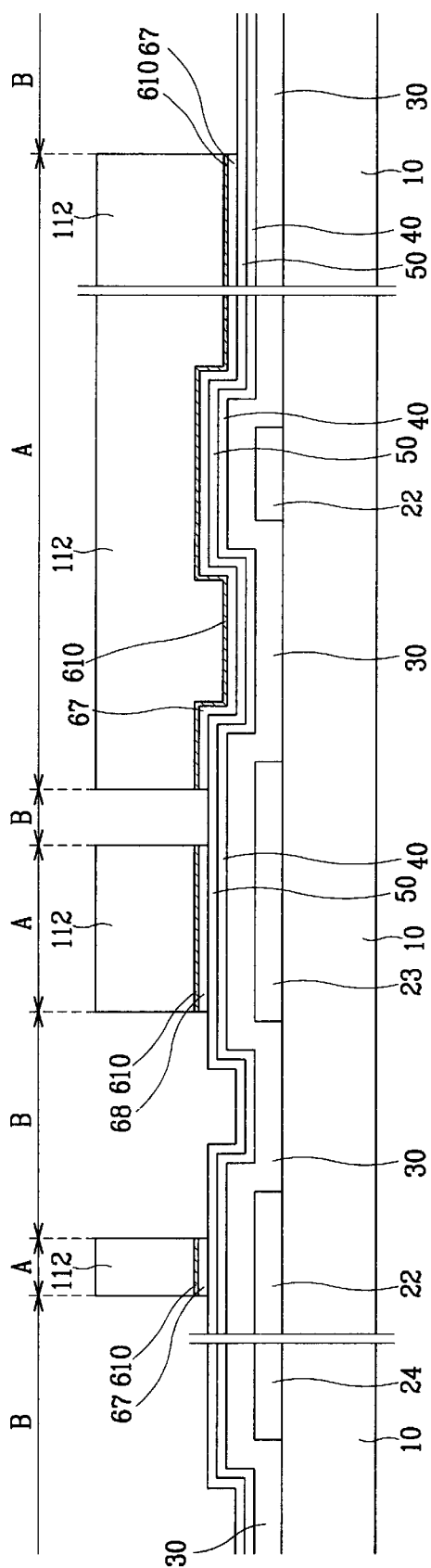
Figure 17B:
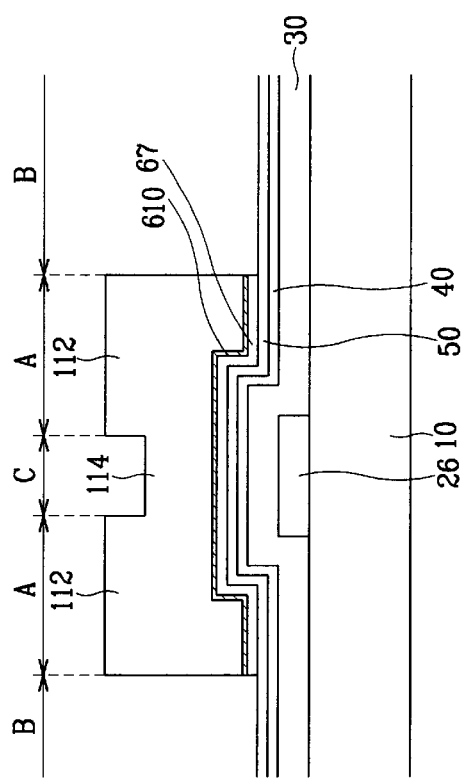

For this purpose, as shown in FIGS. 17A and 17B, the conductive layer 602 and the overlying intermetallic compound layer 610 at the remaining area B are removed to expose the underlying doped amorphous silicon-based layer 50. Either dry etching or wet etching can be used for removing the conductive layer 602 and the intermetallic compound layer 610, and the etching condition should be established such that the conductive layer 602 is etched while not etching the photoresist pattern portions 112 and 114. However, in the case of dry etching, it is difficult to find such an etching condition. Therefore, the photoresist pattern portions 112 and 114 may be etched together provided that the thickness of the second photoresist pattern 114 is so large as to not expose the underlying conductive layer 602.

In case the conductive layer 602 is formed of Mo or MoW alloy, Al or Al alloy, or Ta, either dry etching or wet etching may be used. However, considering that Cr is not well removed through dry etching, wet etching is preferably used for the Cr-based conductive layer 602 with an etching solution of CeNHO$_3$. In case dry etching is used for the Mo or MoW-based conductive layer 602, the etching gas may be a mixture of CF$_4$ and HCl, or CF$_4$ and O$_2$.

As a result, source/drain conductive patterns 67 and storage capacitor conductive patterns 68 remain at the A and C areas, and the doped amorphous silicon-based layer 50 is exposed at the remaining B area. The conductive patterns 67 and 68 have the same shape as the data wire except that the source and drain electrodes 65 and 66 are not yet separated. Furthermore, in the case of dry etching, the photoresist pattern portions 112 and 114 are partially removed by a predetermined thickness.

Thereafter, as shown in FIGS. 18A and 18B, the doped amorphous silicon-based layer 50 and the underlying semiconductor layer 40 are simultaneously removed through dry etching together with the second photoresist pattern portion 114. The etching should be made in condition that the photoresist pattern portions 112 and 114, the doped amorphous silicon-based layer 50, and the semiconductor layer 40 (the two silicon layers having no etching selectivity) are simultaneously etched while not etching the gate insulating layer 30. Particularly, the etching ratios related to the photoresist pattern portions 112 and 114 and the semiconductor layer 40 should be substantially the same. For instance, with the use of a mixture of SF$_6$ and HCL or SF$_6$ and O$_2$, the two layers can be etched by substantially the same thickness. In case the etching ratios with respect to the photoresist pattern 112 and 114 and the semiconductor layer 40 are the same, the thickness of the second photoresist pattern portion 114 should be the same as or less than the sum in thickness of the semiconductor layer 40 and the doped amorphous silicon-based layer 50.

Consequently, the second photoresist pattern portion 114 at the channel area C is removed while exposing the source and drain conductive patterns 67, and the doped amorphous silicon-based layer 50 and the semiconductor layer 40 at the B area are removed while exposing the underlying gate insulating layer 30. Meanwhile, the first photoresist pattern portion 112 at the A area is also etched while being reduced in thickness. Furthermore, in this step, the semiconductor patterns 42 and 48 completed.

Thereafter, the photoresist residue on the source/drain conductive pattern 67 is removed through ashing.

Figures 19A, 19B:
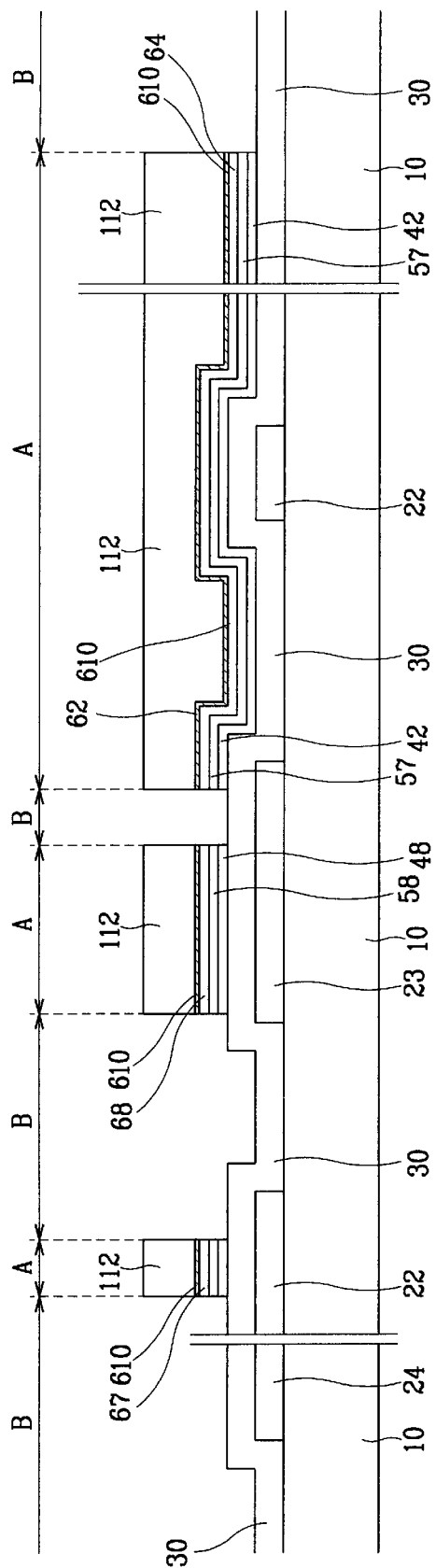

As shown in FIGS. 19A and 19B, the source/drain conductive pattern 67 at the channel area C, and the underlying ohmic contact patterns 57 are removed through etching. At this time, dry etching may be performed for both of the source/drain conductive patterns 67 and the ohmic contact patterns 57, or wet etching may be performed for the source/drain conductive pattern 67 while dry etching for the ohmic contact patterns 57. In the former case, the etching selection ratios for the source/drain conductive patterns 67 and the ohmic contact patterns 57 must be high. This is because in case the etching selection ratios are low, it is difficult to find the etching stop point and to control the thickness of the semiconductor patterns at the channel area C. For instance, the source/drain conductive pattern 67 may be etched using a mixture of SF$_6$ and O$_2$. In the latter case, the side of the source/drain conductive pattern 67 suffering the wet etching is etched, but the ohmic contact patterns 57 suffering the dry etching is not nearly etched while forming stepped portions. The ohmic contact patterns 57 and the semiconductor patterns 42 may be etched using a mixture of CF$_4$ and HCl, or CF$_4$ and O$_2$. In case the mixture of CF$_4$ and O$_2$ is used, the semiconductor patterns 42 may bear a uniform thickness. At this time, the semiconductor patterns 42 as well as the first photoresist pattern portion 112 may be partially reduced in thickness through the etching. The etching should be made in condition that the gate insulating layer 30 is not etched. The first photoresist pattern portion 112 should be so thick as to not expose the underlying data wires through the etching.

Consequently, the source and drain electrodes 65 and 66 are separated from each other, and the data wires and the underlying ohmic contact patterns 55, 56 and 58 are completed.

Finally, the first photoresist pattern portion 112 left at the data wires area A is removed. However, the first photoresist pattern portion 112 may be removed after the source/drain conductive pattern 67 at the channel area C is removed while leaving the underlying ohmic contact patterns 57.

In the above process, either the wet etching and the dry etching are alternated, or only the dry etching is used. In the former case, the processing is relatively easy, but it is difficult to find suitable etching conditions. In the latter case, it is easy to find suitable etching conditions, but the processing becomes complicated.

As described above, the data wires, the semiconductor patterns 42 and 48, and the ohmic contact patterns 55, 56 and 58 are formed using only one mask. As the intermetallic compound 610 is patterned together with the conductive layer 602, it is left over on the data wires.

Figure 20A:
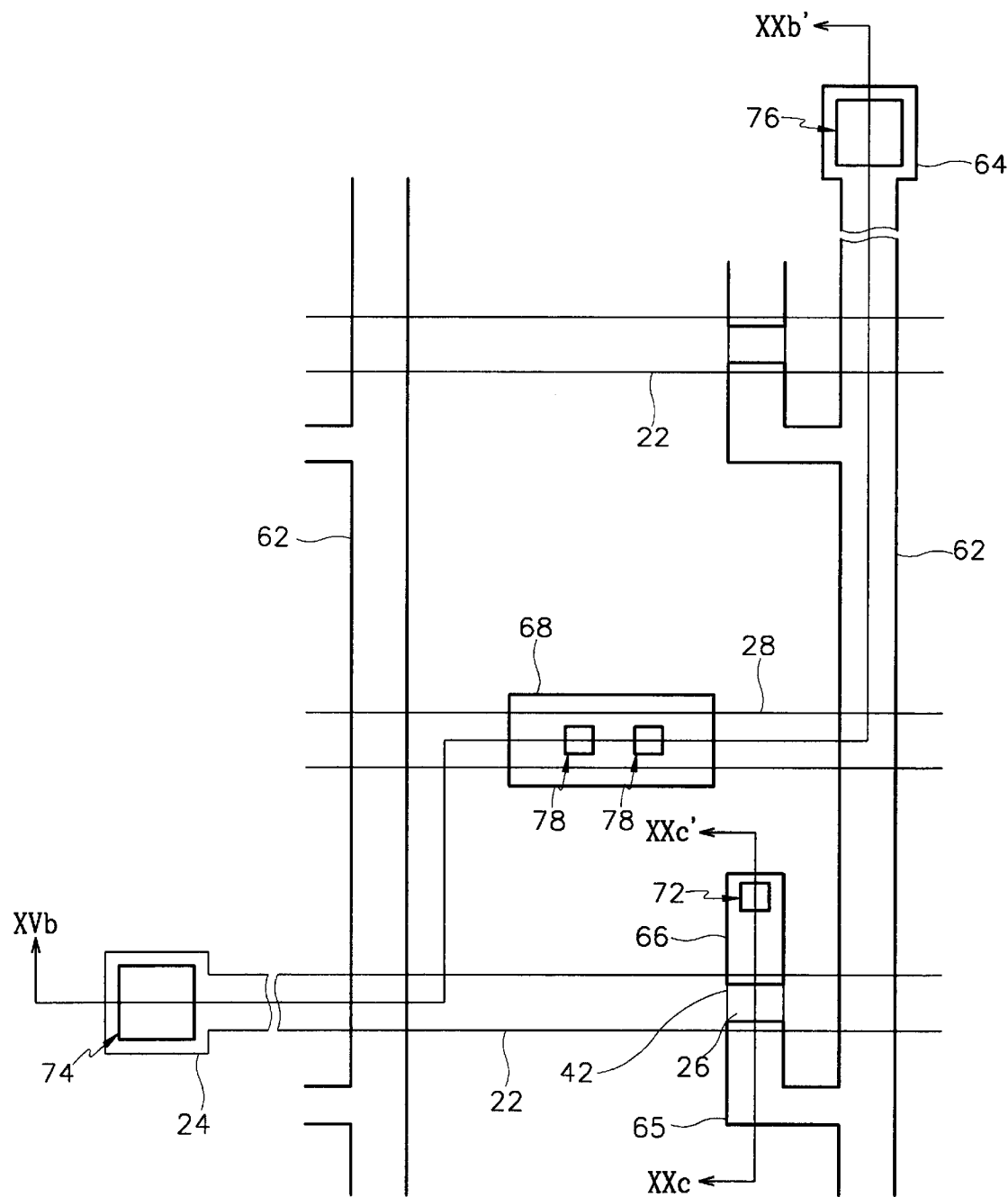

As shown in FIGS. 20A, 20B and 20C, silicon nitride is deposited on the substrate 10 through CVD, or an organic insulating material is spin-coated on the substrate 10 to thereby form a protective layer 70 with a thickness of 3000 Å or more. The protective layer 70 is etched together with the gate insulating layer 30 through a mask to thereby form the first contact hole 72, the second contact hole 74, the third contact hole 76 and the fourth contact hole 78 respectively exposing the drain electrode 66, the gate pad 24, the data pad 64, and the storage capacitor conductive pattern 68.

At this time, the intermetallic compound layer 610 on the drain electrodes 66, the data pads 64 and the storage capacitor conductive pattern 68 is exposed through the first, third and fourth contact holes 72, 76 and 78.

Finally, as shown in FIGS. 9, 10 and 11, an IZO-based layer with a thickness of 400–500 Å is deposited on the resultant substrate comprising the protective layer 70 and the contact holes 72, 74, 76 and 78. And the IZO-based layer is etched through photolithography to thereby form pixel electrodes 82 electrically connecting the intermetallic compound layer 610 of the drain electrodes 66 and the storage capacitor conductive patterns 68 by contacting the intermetallic compound layer 610 on the drain electrodes 66 and the storage capacitor conductive patterns through the first and fourth contact holes 72 and 78, subsidiary gate pad 84 connecting the gate pad 24 through the second contact hole 74, and subsidiary data pad 86 electrically connecting the data pad 64 by contacting the intermetallic compound layer 610 on the data pad 64 through the third contact hole 76.

In this preferred embodiment, the data wire, the ohmic contact patterns 55, 56 and 58, and the semiconductor patterns 42 and 48 are formed using one mask while separating the source electrode 65 from the drain electrode 66. This simplifies the processing steps. Furthermore, an intermetallic compound layer 610 is formed between the aluminum-based layer and the IZO-based layer through annealing, and this improves the contact characteristic between them.

Regarding the second preferred embodiment, in a thin film transistor array substrate with a size of 16.5 inch where a buffer layer 603 is formed of MoW alloy at about 150° C. and annealed at about 200° C. for two hours and the first to fourth contact holes 72, 74, 76 and 78 were established to be in the range of 4×4 μm–7×7 μm, the contact resistance at the contact portions was measured to be about E4Ω/200EA. Therefore, the contact resistance at the contact portions be significantly reduced.

Meanwhile, in the second preferred embodiment, instead of removing the buffer layer 603 deposited on the data wires, it may be used for the data wires together with the intermetallic compound layer 610 based thereon.

For that purpose, the following intermediary processing steps may be employed.

Again, as shown in FIGS. 14A and 14B, an aluminum-based conductive layer 602 and a buffer layer 603 are sequentially deposited on the substrate 10 with the gate insulating layer 30 and the semiconductor patterns 42. At this time, another metallic layer 601(as shown not in FIGS. 14A and 14B but FIGS. 21 and 22), referred to as the "lower layer" may be formed under the conductive layer 602, referred to as the "upper layer."

The buffer layer 603 is deposited on the upper layer 602 at 150° C. or more to thereby form an intermetallic compound layer 610 between the upper layer 602 and the buffer layer 603. The intermetallic compound layer 610 is formed of the material for the upper layer 602, and the material for the buffer layer 603. For example, the intermetallic compound layer 610 may be formed of Al—Mo alloy, Al—Ti alloy, Al—Ta alloy, or Al—Cr alloy. Any metallic material capable of forming a compound in reaction with Al at 150° C. or more can be used for the buffer layer 603. In this case, the annealing process for forming the intermetallic compound layer 610 may be omitted.

The thickness of the intermetallic compound layer 610 is determined depending upon the temperature and time period for depositing the buffer layer 603. Therefore, it is preferable to control the deposition temperature and time in an appropriate manner. The buffer layer 603 is established to have a thickness such that an intermetallic compound layer 610 can be formed between the buffer layer 603 and the upper layer 602. For instance, when it is intended to form an intermetallic compound layer 610 with a thickness of 10 Å or more, the buffer layer 603 should be established to be 50 Å or more thick.

Figure 21:
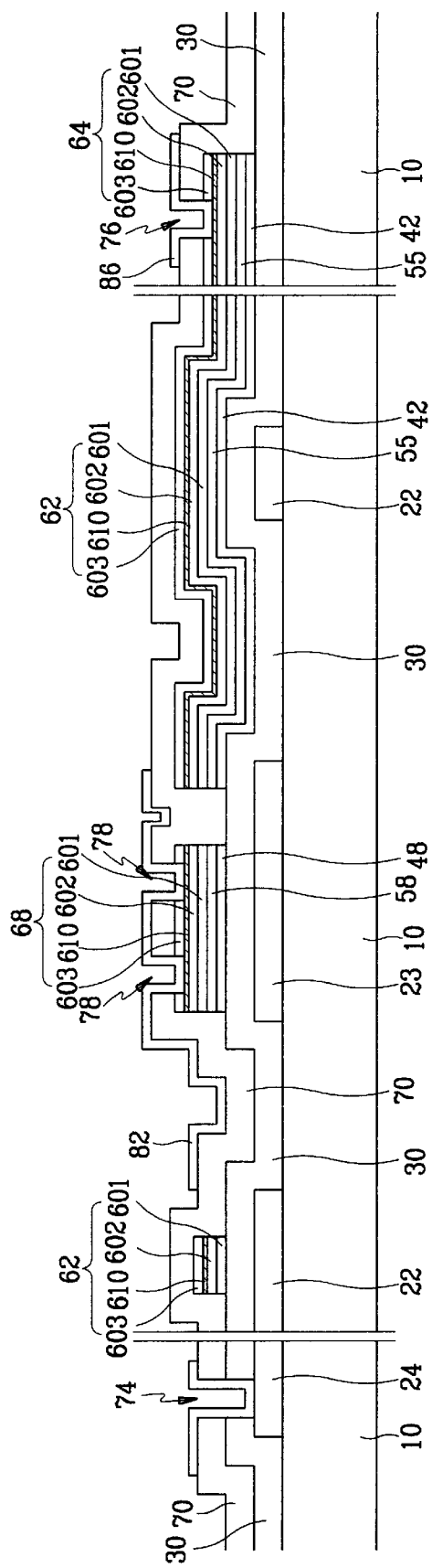
FIGS. 21 and 22 are another cross sectional views of the thin film transistor array substrate taken along the X–X' line and the XI–XI' line of FIG. 9, respectively.
Figure 22:
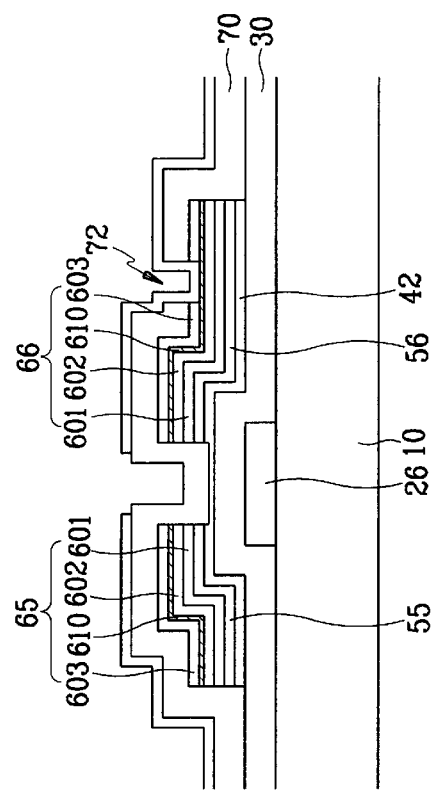

Then, instead of removing the buffer layer 603, the multiple-layered structure of the buffer layer 603, the intermetallic compound 610, the upper layer 602 and the lower layer 601 is patterned through photolithography to thereby form a multiple-layered data wires shown in FIGS. 21 and 22.

Thereafter, a protective layer 70 is formed, and the first contact hole 72, the second contact hole 74 and the third contact hole 76 are formed in the protective layer 70 or the gate insulating layer 30. Pixel electrodes 82, subsidiary gate pads 84, and subsidiary data pads 86 are subsequently formed.

When the buffer layer 603 is formed of a Mo-based material that is well etched by the etching gas for silicon nitride, it is liable to be etched during the process of etching the protective layer 70 or the gate insulating layer 30. In this case, the underlying intermetallic compound layer 610 may be exposed to the outside. The intermetallic compound layer 610 prevents formation of an oxide layer on the upper layer 602 while protecting the upper layer 602.

Meanwhile, in case the intermetallic compound layer 610 is exposed to the outside, it may be oxidized under the air atmosphere. However, since the intermetallic compound layer 610 bears good conductive characteristic, it does not affect the contact characteristic between the upper layer 602 and the IZO-based layer.

The first contact holes 72 are formed in the protective layer 70 and the buffer layer 603 of the drain electrodes 66 to expose the intermetallic compound layer 610 of the drain electrodes 66, and the third contact holes 76 are formed in the protective layer 70 and the buffer layer 603 of the data pads 64 to expose the intermetallic compound layer 610 of the data pads 64. Therefore, the IZO-based layer for the pixel electrodes 82 and the subsidiary data pads 86 contacts the aluminum-based layer for the drain electrodes 66 and the data pads 64 via the intermetallic compound layer 610 in a stable manner while bearing a lower contact resistance.

Furthermore, the first and third contact holes 72 and 76 may be formed only in the protective layer 70 such that the pixel electrodes 82 and the subsidiary data pads 86 directly contact the buffer layer 603 of the drain electrodes 66 and the data pads 64.

In such a structure, the contact resistance between the IZO-based layer and the aluminum-based layer can be reduced sufficiently. Furthermore, an intermetallic compound layer for reducing the contact resistance between the IZO-based layer and the upper layer can be formed without annealing separately. And this simplifies the processing steps.

As described above, in the inventive thin film transistor array substrate, possible formation of a high resistance oxide layer on the aluminum-based layer is prevented while making it possible to design uniform processing conditions. Furthermore, the contact resistance between the IZO-based layer for the pixel electrodes and the subsidiary data pads and the aluminum-based layer for the data wires can be reduced sufficiently. In addition, the date wires are formed with aluminum or aluminum alloy so that the resulting thin film transistor array substrate can be well adapted for use in large size and high definition liquid crystal displays.

In addition to IZO, the transparent conductive material-based layer for the pixel electrodes and the subsidiary gate and data pads may be formed of indium tin oxide (ITO).

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor array substrate, comprising:
   a substrate;
   a gate wire formed on the substrate, the gate wire comprising a gate line and a gate electrode;
   a gate insulating layer covering the gate wire;
   a semiconductor pattern formed on the gate insulating layer;
   a data wire formed on the gate insulating layer and the semiconductor pattern and comprising a data line, a source electrode and a drain electrode, the data wire having a multiple-layered structure comprising a first metallic layer and an intermetallic compound layer;
   a protective layer formed on the data wire and the semiconductor pattern, the protective layer having a first contact hole exposing the drain electrode; and
   a pixel electrode contacting the drain electrode through the first contact hole, wherein the pixel electrode is in direct contact with the intermetallic compound layer in the first contact hole.

2. The thin film transistor array substrate of claim 1, wherein the first metallic layer is formed of a metallic material based on aluminum.

3. The thin film transistor array substrate of claim 1, wherein the intermetallic compound layer comprises at least one of a compound selected from the group consisting of chrome, molybdenum, and molybdenum alloy.

4. The thin film transistor array substrate of claim 1, wherein the intermetallic compound layer is formed of aluminum-molybdenum alloy, aluminum-titanium alloy, aluminum-tantalum alloy, or aluminum-chrome alloy.

5. The thin film transistor array substrate of claim 1, wherein the protective layer has either a single-layered structure formed of an organic material or an inorganic material or a double-layered structure formed of a layer based on an organic material and a layer based on an inorganic material.

6. The thin film transistor array substrate of claim 1, wherein the pixel electrode is formed of indium tin oxide or indium zinc oxide.

7. The thin film transistor array substrate of claim 1, further comprising ohmic contact patterns interposed between the semiconductor pattern and the data wire and formed of a material having a high impurity concentration.

8. The thin film transistor array substrate of claim 1, wherein the semiconductor pattern has the same shape as the data wire except for channel portions between the source electrode and the drain electrode.

9. The thin film transistor array substrate of claim 1, wherein the intermetallic compound layer is formed on the first metallic layer.

10. The thin film transistor array substrate of claim 1, wherein the gate wire further comprises a gate pad connected to the gate line,
    the data wire further comprises a data pad connected to the data line,
    the protection layer and the gate insulating layer have a second contact hole exposing the gate pad, and the protection layer has a third contact hole exposing the data pad, and
    the thin film transistor array substrate further comprises a subsidiary gate pad and a subsidiary data pad electrically connected to the gate pad and the data pad through the second contact hole and the third contact hole, respectively.

11. The thin film transistor array substrate of claim 1, wherein the data wire further comprises a second metallic layer covering the intermetallic compound layer, the second metallic layer and the protection layer having the first contact hole exposing the drain electrode.

12. The thin film transistor array substrate of claim 11, wherein the data wire further comprises a third metallic layer placed under the first metallic layer.

13. The thin film transistor array substrate of claim 11, herein the second metallic layer is formed with a metallic material selected from the group consisting of molybdenum, titanium, tantalum, and chrome.

14. A thin film transistor array substrate, comprising:
    a substrate;
    a gate wire formed on the substrate, the gate wire comprising a gate line and a gate electrode;
    a gate insulating layer covering the gate wire;
    a semiconductor pattern formed on the gate insulating layer;
    a data wire formed on the gate insulating layer and the semiconductor pattern and comprising a data line, a source electrode and a drain electrode, the data wire having a multiple-layered structure comprising a first metallic layer including a first metal, an intermetallic compound layer on the first metallic layer and a second metallic layer including a second metal on the intermetallic compound layer, the intermetallic compound layer including the first metal and the second metal;
    a protective layer formed on the data wire and the semiconductor pattern, the protective layer having a first contact hole exposing the drain electrode; and
    a pixel electrode contacting the drain electrode through the first contact hole, wherein the pixel electrode is in direct contact with the second metallic layer in the first contact hole.

15. The thin film transistor array substrate of claim 11, wherein the gate wire further comprises a gate pad connected to the gate line, the data wire further comprises a data pad connected to the data line, the gate insulating layer and the protection layer have a second contact hole exposing the gate pad, and the second metallic layer and the protection layer have a third contact hole exposing the data pad, and the thin film transistor array substrate further comprises a subsidiary gate pad and a subsidiary data pad electrically connected to the gate pad and the data pad through the second contact hole and the third contact hole, respectively.

16. The thin film transistor array substrate of claim 1, wherein the intermetallic compound comprises a metallic material based on aluminum.

17. The thin film transistor array substrate of claim 16, wherein the first metallic layer is formed of a metallic material based on aluminum.

18. The thin film transistor array substrate of claim 17, wherein the intermetallic compound comprises at least one of a compound selected from the group consisting of chrome, molybdenum, and molybdenum alloy.

19. The thin film transistor array substrate of claim 17, wherein the intermetallic compound is formed of aluminum-chrome alloy, aluminum-molybdenum alloy, aluminum-titanium alloy or aluminum-tantalum alloy.

20. The thin film transistor array substrate of claim 17, wherein the pixel electrode comprises indium zinc oxide.

21. The thin film transistor array substrate of claim 1, wherein the intermetallic compound is formed of a metal alloy including at least two different metals.

* * * * *

UNITED STATES PATENT AND TRADEMARK OFFICE
CERTIFICATE OF CORRECTION

PATENT NO.     : 6,518,630 B2
DATED          : February 11, 2003
INVENTOR(S)    : Chun-Gi You et al.

It is certified that error appears in the above-identified patent and that said Letters Patent is hereby corrected as shown below:

<u>Column 16,</u>
Line 38, change "herein" to -- wherein --.

Signed and Sealed this

Twenty-fifth Day of March, 2003

JAMES E. ROGAN
*Director of the United States Patent and Trademark Office*